(12) United States Patent
Ishihara et al.

(10) Patent No.: US 8,735,739 B2
(45) Date of Patent: May 27, 2014

(54) WIRING BOARD AND METHOD FOR MANUFACTURING THE SAME

(75) Inventors: Teruyuki Ishihara, Ogaki (JP);
Hidetoshi Noguchi, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 199 days.

(21) Appl. No.: 13/249,507

(22) Filed: Sep. 30, 2011

(65) Prior Publication Data

US 2012/0181074 A1 Jul. 19, 2012

Related U.S. Application Data

(60) Provisional application No. 61/432,322, filed on Jan. 13, 2011.

(51) Int. Cl.
*H05K 1/11* (2006.01)
*H05K 3/46* (2006.01)

(52) U.S. Cl.
CPC .................. *H05K 3/4691* (2013.01)
USPC ......................... 174/261; 174/255

(58) Field of Classification Search
CPC ............... H05K 3/4691; H05K 1/183; H05K 2201/09036; H05K 2201/09127; H05K 2203/107; H05K 3/3452; H05K 3/46; H05K 3/4697
USPC .......... 361/760, 761, 767, 763; 174/255, 256, 174/260, 261; 29/847
See application file for complete search history.

(56) References Cited

U.S. PATENT DOCUMENTS

| | | | |
|---|---|---|---|
| 8,319,111 B2* | 11/2012 | Saiki et al. .................... | 174/255 |
| 2004/0009335 A1* | 1/2004 | Kojima et al. ................ | 428/209 |
| 2004/0160751 A1* | 8/2004 | Inagaki et al. ................ | 361/763 |
| 2007/0015351 A1* | 1/2007 | Tomimori et al. ............ | 438/612 |
| 2011/0220951 A1* | 9/2011 | Kim et al. ...................... | 257/98 |

FOREIGN PATENT DOCUMENTS

| | | |
|---|---|---|
| JP | 4-369252 A | 12/1992 |
| JP | 2003-110245 A | 4/2003 |
| JP | 2007-266195 A | 10/2007 |
| JP | 2007-266196 | 10/2007 |

* cited by examiner

*Primary Examiner* — Yuriy Semenenko
(74) *Attorney, Agent, or Firm* — Oblon, Spivak, McClelland, Maier & Neustadt, L.L.P.

(57) ABSTRACT

A wiring board having an insulation layer, and a buildup structure formed on the insulation layer and including insulation layers. The insulation layer and the buildup structure form a board structure in which a cavity portion having an opening on a surface of the buildup structure on the opposite side of the insulation layer is formed. The cavity portion is extending through one or more of the insulation layers in the buildup structure and has a groove portion formed on the bottom surface of the cavity portion along a wall surface of the cavity portion. The board structure composed of the insulation layer and the buildup structure has a pad formed on the bottom surface of the cavity portion in a position farther from the wall surface of the cavity portion than the groove portion.

12 Claims, 20 Drawing Sheets

WIRING BOARD AND METHOD FOR MANUFACTURING THE SAME

CROSS-REFERENCE TO RELATED APPLICATIONS

The present application claims the benefits of priority to U.S. Application No. 61/432,322, filed Jan. 13, 2011. The contents of that application are incorporated herein by reference in their entirety.

BACKGROUND OF THE INVENTION

1. Field of the Invention

The present invention relates to a wiring board and its manufacturing method.

2. Discussion of the Background

Japanese Laid-Open Patent Publication No. 2007-266196 describes a wiring board in which a cavity is formed to open toward one side and there are multiple pads on the bottom surface of the cavity, and a method for manufacturing such a wiring board. The contents of Japanese Laid-Open Patent Publication No. 2007-266196 are incorporated herein by reference in their entirety in the present application.

SUMMARY OF THE INVENTION

According to one aspect of the present invention, a wiring board includes an insulation layer, and a buildup structure formed on the insulation layer and including insulation layers. The insulation layer and the buildup structure form a board structure in which a cavity portion having an opening on a surface of the buildup structure on the opposite side of the insulation layer is formed. The cavity portion is extending through one or more of the insulation layers in the buildup structure and has a groove portion formed on the bottom surface of the cavity portion along a wall surface of the cavity portion. The board structure composed of the insulation layer and the buildup structure has a pad formed on the bottom surface of the cavity portion in a position farther from the wall surface of the cavity portion than the groove portion.

According to another aspect of the present invention, a method for manufacturing a wiring board includes preparing an insulation layer having a conductive layer including a pad formed on a surface of the insulation layer, covering the pad with a mask layer which is separable from the insulation layer and is substantially corresponding to the bottom surface of a cavity portion, forming on the insulation layer, the conductive layer and the mask layer a buildup structure having insulation layers, irradiating laser on a surface of the buildup structure on the opposite side of the insulation layer substantially along the shape of the mask layer such that the laser forms a separable portion including the mask layer in the buildup structure and a groove portion in the insulation layer substantially along the shape of the mask layer, and removing the separable portion formed in the buildup structure such that the cavity portion having the groove portion on the surface of the insulation layer is formed and the pad is exposed on the bottom surface of the cavity portion in the position farther from the wall surface of the cavity portion than the groove portion.

According to yet another aspect of the present invention, a method for manufacturing a wiring board includes forming a board structure having an insulation layer, a buildup structure formed on the insulation layer and a pad formed in the board structure, the buildup structure including insulation layers, and forming a cavity portion in the board structure such that the cavity portion has an opening on a surface of the buildup structure on the opposite side of the insulation layer, the cavity portion is extending through one or more of the insulation layers in the buildup structure, the cavity portion has a groove portion formed on the bottom surface of the cavity portion along a wall surface of the cavity portion, and the pad formed in the board structure is exposed on the bottom surface of the cavity portion in the position farther from the wall surface of the cavity portion than the groove portion. The forming of the board structure includes covering the pad with a separable mask layer which is substantially corresponding to the bottom surface of the cavity portion. The forming of the cavity portion in the board structure includes irradiating laser on the surface of the buildup structure substantially along the shape of the mask layer such that the laser forms a separable portion including the separable mask layer in the buildup structure and a groove portion in the bottom surface of the cavity portion substantially along the shape of the mask layer and removing the separable portion formed in the buildup structure such that the cavity portion having the groove portion is formed and the pad is exposed in the cavity portion formed in the board structure.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
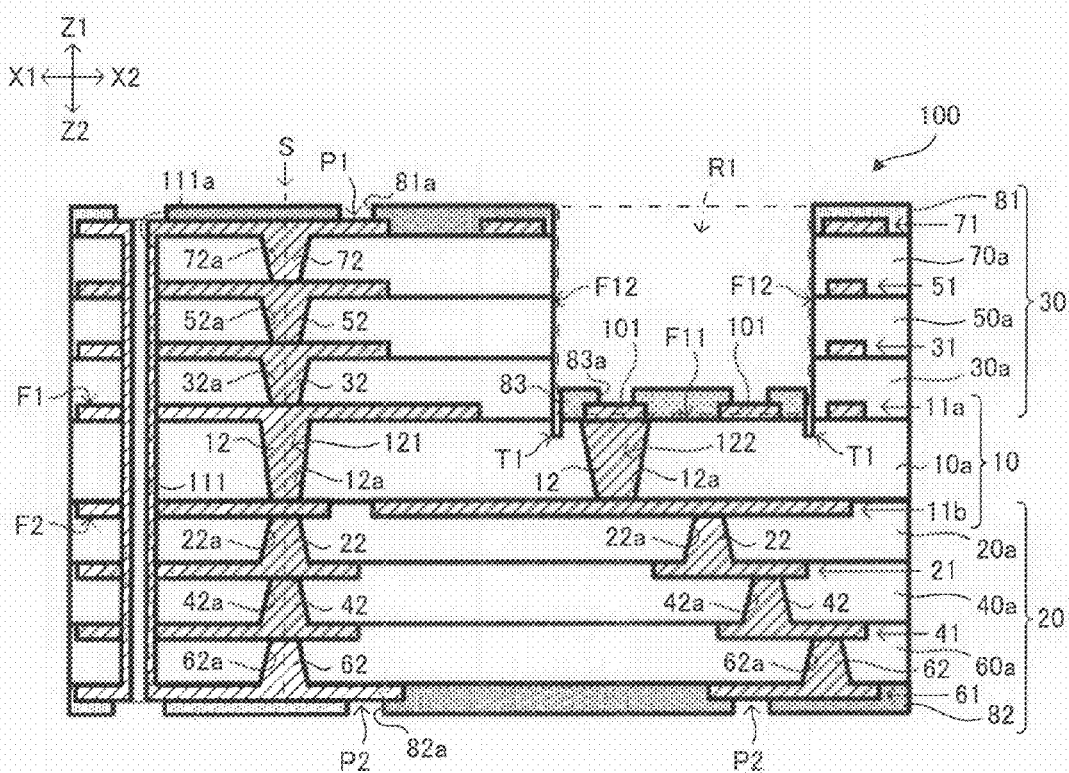
FIG. 1 is a cross-sectional view showing a wiring board according to an embodiment of the present invention.

The embodiments will now be described with reference to the accompanying drawings, wherein like reference numerals designate corresponding or identical elements throughout the various drawings.

In the drawings, arrows (Z1, Z2) each indicate a lamination direction in a wiring board corresponding to a direction along a normal line (or a direction of the thickness of a core substrate) to the main surfaces (upper and lower surfaces) of the wiring board. On the other hand, arrows (X1, X2) and (Y1, Y2) each indicate a direction perpendicular to a lamination direction (or a direction to a side of each layer). The main surfaces of the wiring board are on the X-Y plane. Side surfaces of the wiring board are on the X-Z plane or the Y-Z plane.

Two main surfaces facing opposite directions of a normal line are referred to as a first surface (the Z1-side surface) and a second surface (the Z2-side surface). In lamination directions, the side closer to the core is referred to as a lower layer (or inner-layer side), and the side farther from the core is referred to as an upper layer (or outer-layer side). On the X-Y plane, a side farther from the cavity (its gravity center, in particular) is referred to as an outer side, and a side closer to the cavity is referred to as an inner side. "Directly on" means in direction Z (the Z1 side or the Z2 side).

Except for a plain conductive layer, a conductive layer is formed with a conductive portion (hereinafter referred to as a conductive pattern) and a non-conductive portion. A conductive layer may include a conductive pattern that forms an electric circuit such as wiring (including ground), a pad and a land, or it may include a plain conductive pattern that does not form an electric circuit. Alternatively, in a wiring board with a built-in electronic component or another wiring board, the electrodes of the electronic component or the pads of the other wiring board may be positioned so that they are included in a conductive layer of the wiring board. Such pads include external connection terminals, via connection terminals and the like.

Opening portions include holes, grooves, notches, slits and so forth. Holes are not limited to penetrating holes, and non-penetrating holes are also referred to as holes. Holes include via holes and through holes. Hereinafter, the conductor formed in a via hole (its wall and bottom surfaces) is referred to as a via conductor, and the conductor formed in a through hole (its wall surface) is referred to as a through-hole conductor.

Plating includes wet plating such as electrolytic plating as well as dry plating such as PVD (physical vapor deposition) and CVD (chemical vapor deposition).

"Preparing" includes situations in which material and components are purchased and manufactured accordingly as well as situations in which finished products are purchased and used accordingly.

"Surround" includes situations in which a ring without any break surrounds a region completely (see FIG. 18), along with situations in which a ring with a partial break surrounds a region (see FIG. 2~FIG. 3B), and other situations in which a ring formed with a broken line surrounds a region (see FIG. 19) and the like. A ring means a planar shape formed by connecting both ends of a line; and rings include not only a circle but also polygons.

Wiring board 100 of the present embodiment is a printed wiring board. As shown in FIG. 1, wiring board 100 has wiring board 10, insulation layers (20a, 30a, 40a, 50a, 60a, 70a), conductive layers (21, 31, 41, 51, 61, 71) and via conductors (22, 32, 42, 52, 62, 72). Wiring board 10 is the core substrate for wiring board 100. Hereinafter, one of the upper and lower surfaces (two main surfaces) of wiring board 10 is referred to as first surface (F1) and the other as second surface (F2).

Wiring board 10 has insulation layer (10a), conductive layers (11a, 11b) and via conductors 12. Conductive layer (11a) is formed on the first-surface (F1) side of insulation layer (10a), and conductive layer (11b) is formed on the second-surface (F2) side of insulation layer (10a). Via holes (12a) that penetrate through insulation layer (10a) are formed in insulation layer (10a). Via conductors 12 are formed by filling, for example, copper plating in via holes (12a). Multiple via conductors 12 formed in insulation layer (10a) include via conductors 121 that form filled-stack structure "S" and via conductors 122 that are electrically connected to pads 101 in cavity (R1). Pads 101 are formed directly on via conductors 122 and are directly connected to via conductors 122.

Buildup section 30 (laminated section) is formed on the first-surface (F1) side of wiring board 10, and buildup section 20 is formed on the second-surface (F2) side of wiring board 10. Buildup section 30 is formed with insulation layers (30a, 50a, 70a), conductive layers (31, 51, 71) and solder resist 81. Three insulation layers (30a, 50a, 70a) and three conductive layers (31, 51, 71) are alternately laminated, and lowermost insulation layer (30a) is formed on first surface (F1) of wiring board 10 and solder resist 81 is formed on the outermost layer of the first-surface (F1) side. Also, buildup section 20 is formed with insulation layers (20a, 40a, 60a), conductive layers (21, 41, 61) and solder resist 82. Three insulation layers (20a, 40a, 60a) and three conductive layers (21, 41, 61) are alternately laminated, and lowermost insulation layer (20a) is formed on second surface (F2) of wiring board 10 and solder resist 82 is formed on the outermost layer of the second-surface (F2) side. Insulation layers (20a, 30a, 40a, 50a, 60a, 70a) each correspond to an interlayer resin insulation layer. Instead of solder resists (81, 82), coverlays may also be used.

Conductive layer 71 becomes the outermost conductive layer on the first-surface (F1) side, and conductive layer 61 becomes the outermost conductive layer on the second-surface (F2) side. Solder resists (81, 82) are formed on conductive layers (71, 61) respectively. However, since opening portions (81a, 82a) are formed in solder resists (81, 82) respectively, predetermined spots of conductive layer 71 (spots corresponding to opening portions 81a) are exposed without being covered by solder resist 81 and become pads (P1). Also, predetermined spots of conductive layer 61 (spots corresponding to opening portions 82a) become pads (P2). Pads (P1) become external connection terminals for mounting an electronic component, for example; and pads (P2) become external connection terminals for electrical connection with another wiring board, for example. However, the uses of pads (P1, P2) are not limited to those, and they may be used for any other purposes.

Insulation layer (10a) is made of a rigid substrate, for example. Insulation layer (10a) is made by, for example, impregnating glass cloth (core material) with epoxy resin (hereinafter referred to as glass-epoxy resin). The core material is a material whose thermal expansion coefficient is smaller than the primary material (epoxy resin in the present embodiment). As for such a core material, inorganic material such as glass fiber (glass cloth or glass non-woven fabric, for example), aramid fiber (aramid non-woven fabric, for example) or silica filler is preferred. However, the shape, thickness, material and the like of insulation layer (10a) are basically selected freely. For example, instead of epoxy resin, the following may be used: polyester resin, bismaleimide triazine resin (BT resin), imide resin (polyimide), phenol resin, allyl polyphenylene ether resin (A-PPE resin) and the like. Insulation layer (10a) may be formed with multiple layers made of different materials. Insulation layer (10a) may also be made of a flexible substrate, for example (see later-described FIG. 29).

Insulation layers (20a, 30a, 40a, 50a, 60a, 70a) are each made of epoxy resin, for example. Insulation layers (20a) and the like are made of resin without a core material in the present embodiment. However, insulation layers (20a) and the like are not limited to such, and the shape, thickness, material and the like are basically selected freely. For example, it is optional that insulation layers (20a) and the like in buildup sections (20, 30) also contain a core material.

Conductive layers (11a, 11b, 21, 31, 41, 51, 61, 71) each have a two-layer structure of copper foil and copper plating, for example. The detailed structure of conductive layer (11a) (especially pads 101), conductive layer 71 (especially pads P1) and conductive layer 61 (especially pads P2) is described later (see FIG. 5). However, the material for such conductive layer (11a) and others is not limited to such and may be selected freely.

Via conductors 12 are made of copper plating, for example. The shape of via conductors 12 is a tapered column (truncated cone) with a diameter increasing toward the Z1 side, for example. However, the material and the shape of via conductors 12 are not limited to such and may be selected freely.

Via holes (22a, 32a, 42a, 52a, 62a, 72a) are formed in insulation layers (20a, 30a, 40a, 50a, 60a, 70a) respectively. Via conductors (22, 32, 42, 52, 62, 72) are formed respectively by filling copper plating, for example, in via holes (22a) and the like. Via conductors 22 and the like are each shaped as a tapered column (truncated cone) with a diameter increasing toward their respective upper layer, for example. However, the material and shape of via conductors 22 and the like are not limited to such and may be selected freely.

In wiring board 100, filled-stack structure "S" is extended in direction Z by laminating via conductor 12 (especially via conductor 121) and via conductors (22, 32, 42, 52, 62, 72) (each is a filled conductor) on both sides of wiring board 10 (the first-surface (F1) side and the second-surface (F2) side). Adjacent via conductors are adhered (in contact) and are electrically connected to each other. Filled-stack structure "S" electrically connects conductive layers on both surfaces of wiring board 100, namely, conductive layer 71 on the first-surface (F1) side and conductive layer 61 on the second-surface (F2) side.

Filled-stack structure "S" is a so-called full-stack structure where filled conductors throughout the layers are laminated. Thus, ensuring wiring space is easy, and the design flexibility of wiring patterns increases. Also, since wiring in direction X or direction Y is omitted, the wiring length is reduced in interlayer connections. The position and the number of filled-stack structures "S" may be selected freely. For example, there may be multiple filled-stack structures "S."

Through holes (111a), which penetrate through wiring board 100, are formed in wiring board 100, and through-hole conductors 111 are formed by forming copper plating, for example, on wall surfaces of through holes (111a).

Figure 2:
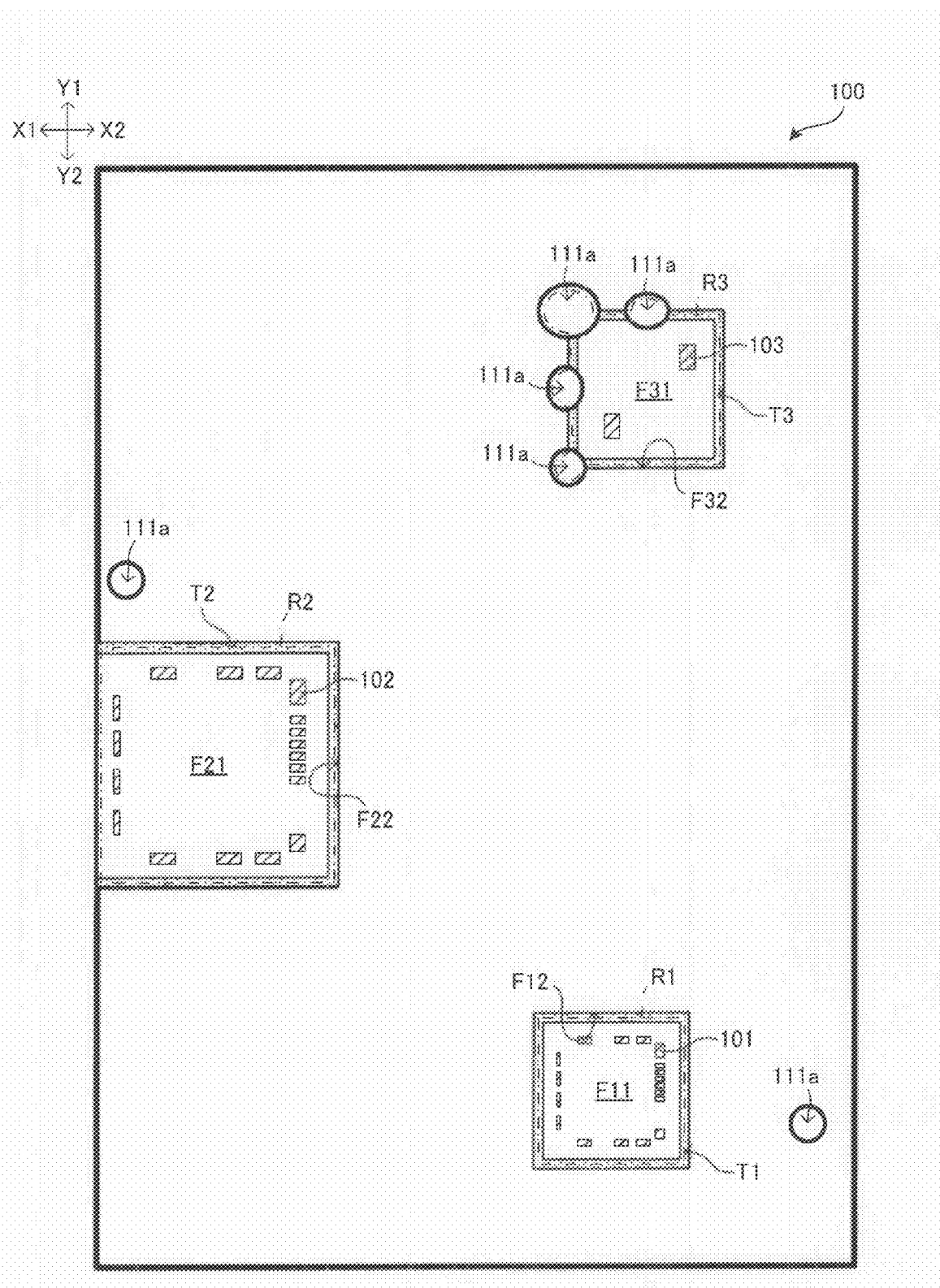
FIG. 2 is a plan view showing how cavities and grooves are formed in a wiring board according to the embodiment of the present invention.

In the present embodiment, cavity (R1), which opens on one side of wiring board 100 (the first-surface (F1) side), is formed in buildup section 30 as shown in FIG. 1. Also, as shown in FIG. 2, wiring board 100 of the present embodiment has cavities (R2, R3), which open on one side of wiring board 100 (the first-surface (F1) side), in addition to cavity (R1). Wall surfaces (F12, F22, F32) of cavities (R1, R2, R3) correspond to side surfaces of buildup section 30. Cavities (R1, R2, R3) are shaped to be substantially rectangular. The number of cavities formed in wiring board 100 is not limited to three, and any other number may be employed. Also, the shape of cavities is selected freely (see later-described FIG. 18).

Cavity (R1) is formed to be a hole. Cavity (R2) is formed to be a notch. The number of wall surfaces of cavity (R2) is three and one side is left open. In addition, cavity (R3) is formed by connecting holes (through holes 111a) that penetrate through wiring board 100 and a hole that penetrates only through buildup section 30 (see cavity (R1) in FIG. 1).

On bottom surface (F11) of cavity (R1), groove (T1) shaped as a rectangular ring, for example, is formed substantially along all the wall surfaces (F12) (four sides) of cavity (R1). Groove (T1) is formed continuously except for later-described connection section (R13) (see FIGS. 3A and 3B). In the present embodiment, groove (T1) is shaped as a rectangular ring where there is substantially no break, and pads 101 are positioned in a partial region of bottom surface (F11) surrounded by groove (T1). Also, on bottom surface (F21) of cavity (R2), groove (T2) is formed entirely along wall surfaces (F22) (three sides) of cavity (R2). In the present embodiment, groove (T2) is formed in a "U" shape and pads 102 are positioned in a partial region of bottom surface (F21) surrounded by groove (T2). In addition, on bottom surface (F31) of cavity (R3), groove (T3) is formed along wall surfaces (F32) of cavity (R3) (excluding portions of through holes (111a)). Groove (T3) is interrupted by through holes (111a). In the present embodiment, groove (T3) is shaped as a rectangular ring having breaks, and pads 103 are positioned in a partial region of bottom surface (F31) surrounded by groove (T3). In the present embodiment, grooves (T1, T2, T3) are formed in insulation layer (10a) (a rigid substrate containing a core material). Therefore, because of the core material, it is easier to adjust the depths of grooves (T1, T2, T3). Also, surface flatness is easily ensured when forming pads and solder resist.

Groove (T1) is formed near wall surfaces (F12) of cavity (R1); groove (T2) is formed near wall surfaces (F22) of cavity (R2); and groove (T3) is formed near wall surfaces (F32) of cavity (R3). Wiring board 100 has the following: pads 101 which are positioned on bottom surface (F11) of cavity (R1) farther from wall surfaces (F12) than groove (T1) is; pads 102 which are positioned on bottom surface (F21) of cavity (R2) farther from wall surfaces (F22) than groove (T2) is; and pads 103 which are positioned on bottom surface (F31) of cavity (R3) farther from wall surfaces (F32) than groove (T3) is.

Figure 3A:
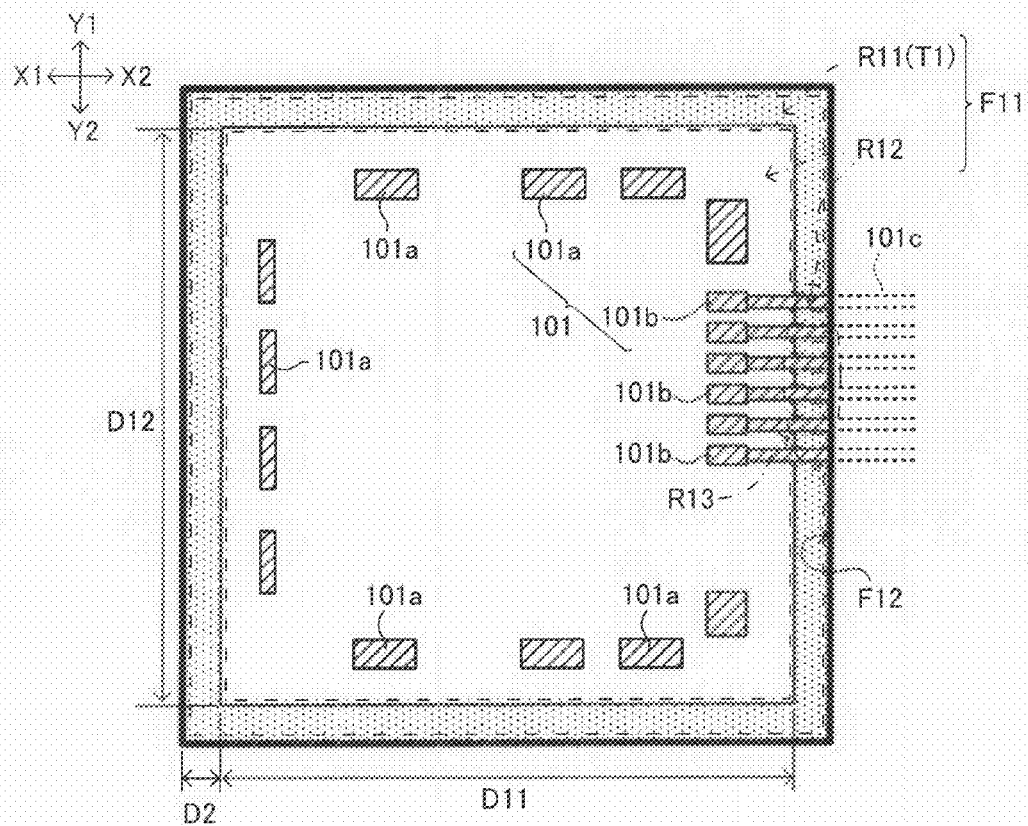
FIG. 3A is a magnified plan view of a cavity in the wiring board shown in FIG. 2.

A magnified view of cavity (R1) is shown in FIG. 3A. Hereinafter, of the entire bottom surface (F11) of cavity (R1), a region where groove (T1) is formed is referred to as groove section (R11), and the rest as non-groove section (R12). Groove section (R11) is positioned mainly along the periphery of cavity (R1), and non-groove section (R12) is positioned mainly inside groove section (R11).

As shown in FIG. 3A, wiring board 100 has pads 101 on non-groove section (R12) surrounded by groove (T1). Pads 101 include multiple pads (101a) and multiple pads (101b). Wiring board 100 has multiple conductive patterns (101c) electrically connected to pads (101b). Pads 101 and conductive patterns (101c) are included in conductive layer (11a). In the present embodiment, conductive patterns (101c) each correspond to wiring that electrically connects a terminal in cavity (R1) (pad 101b) and another circuit outside cavity (R1).

Cavity (R1) reaches first surface (F1) of wiring board 10 from a surface of wiring board 100. The depth of cavity (R1) is preferred to be determined according to the depth of the electronic component to be accommodated in cavity (R1). However, if cavity (R1) is shallower, it is easier to reduce warping in wiring board 100.

In the present embodiment, the planar surface of groove (T1) (on the X-Y plane) is shaped straight with a substantially uniform width. In addition, a cross section of groove (T1) (the cross section perpendicular to the longitudinal direction) in the present embodiment is shaped to have four sides that intersect at substantially right angles. Namely, the width of groove (T1) is constant regardless of its depth. The depth of groove (T1) is approximately 20 μm, for example. Also, width (D2) of groove (T1) (groove section R11) is approximately 100 μm, for example. However, the shape and measurements of groove (T1) are determined freely (see later-described FIGS. 24A-25).

Widths (D11, D12) of non-groove section (R12) surrounded by groove (T1) are each preferred to be determined according to the size of a component to be accommodated in cavity (R1).

In addition, in the present embodiment, conductive patterns (101c) are each formed in a linear shape that extends in direction X. Such conductive patterns (101c) are formed substantially parallel to each other in the vicinity of each other. The L/S (width/distance) of such conductive patterns (101c) are each set at approximately 50 μm/approximately 50 μm, for example.

Figure 3B:
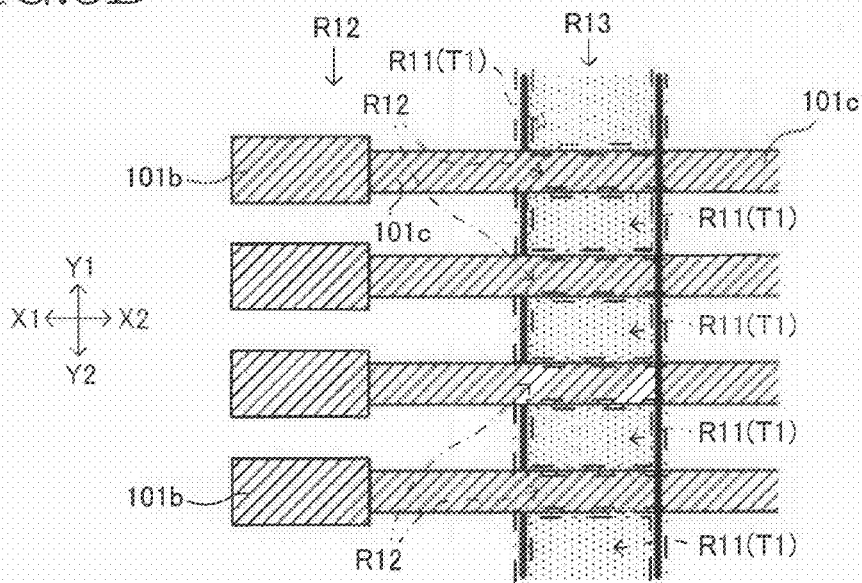
FIG. 3B is a magnified view of the connection section shown in FIG. 3A.

As shown in FIG. 3B (magnified view of FIG. 3A), conductive patterns (101c) are each formed in non-groove section (R12). Namely, conductive patterns (101c) are each formed in a region on bottom surface (F11) of cavity (R1) where groove (T1) is not formed. Then, conductive patterns (101c) extended in direction X are each formed to cross groove (T1), which runs along direction Y. By doing so, portions of groove (T1) and conductive patterns (101c) are alternately positioned in the intersection (hereinafter referred to as connection section (R13)). In the present embodiment, portions of groove (T1) and conductive patterns (101c) are alternately positioned along direction Y. Namely, groove (T1) is formed intermittently in connection section (R13). Also, groove (T1) and conductive patterns (101c) make an angle of approximately 90 degrees in connection section (R13). However, such is not the only option, and the angle at which conductive patterns (101c) cross groove (T1) may be determined freely (see later-described FIG. 22).

In the present embodiment, since multiple conductive patterns (101c) are positioned to be separated by groove (T1), short circuiting between conductive patterns (101c) caused by a solder bridge or the like seldom occurs. As a result, wiring is easily set to be finer.

Figure 4:
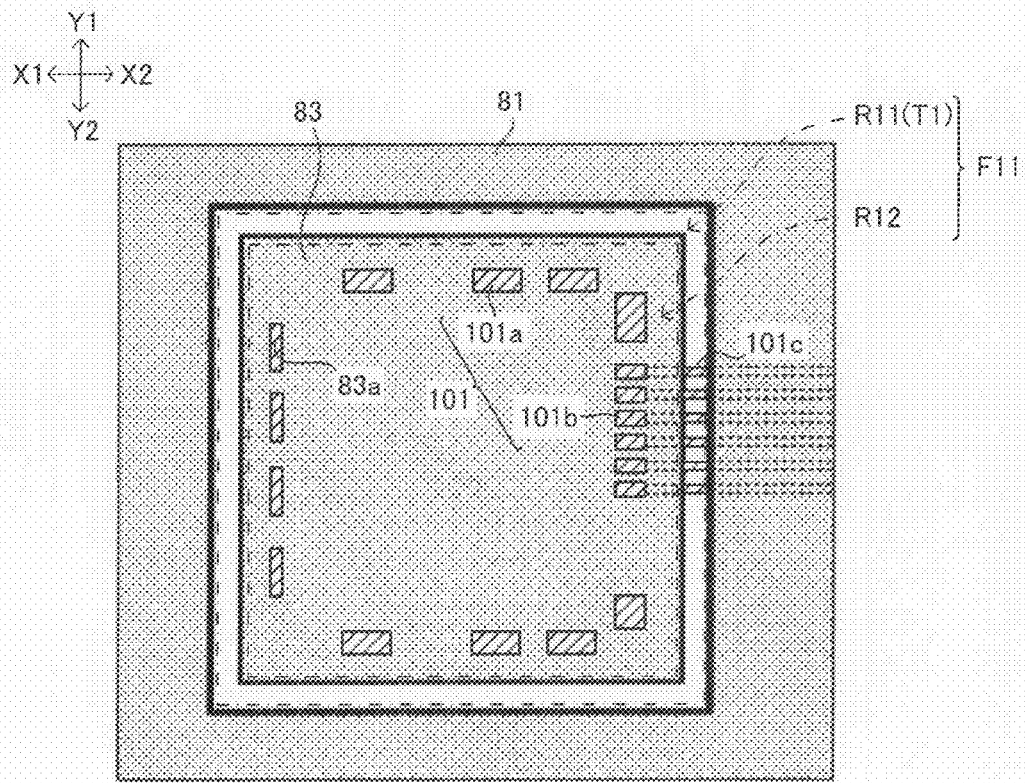
FIG. 4 is a view showing how solder resists are formed in a wiring board according to the embodiment of the present invention.

As shown in FIGS. 1 and 4, in addition to solder resists (81, 82) (outer-layer solder resists) formed on their respective main surfaces), wiring board 100 has solder resist 83 (inner-layer solder resist) on non-groove section (R12) (excluding connection section R13) on bottom surface (F11) of cavity (R1). Solder resist 83 has opening portions (83a) and pads 101 are exposed through opening portions (83a).

In cavity (R1) of the present invention, solder resist is not formed on groove section (R11) of bottom surface (F11) nor on non-groove section (R12) of connection section (R13). Namely, as shown in FIG. 4, conductive patterns (101c) are exposed in non-groove section (R12) of connection section (R13). However, since groove (T1) is formed between conductive patterns (101c) in the present embodiment (see FIG. 3), short circuiting between conductive patterns (101c) is suppressed by groove (T1).

Figure 5:
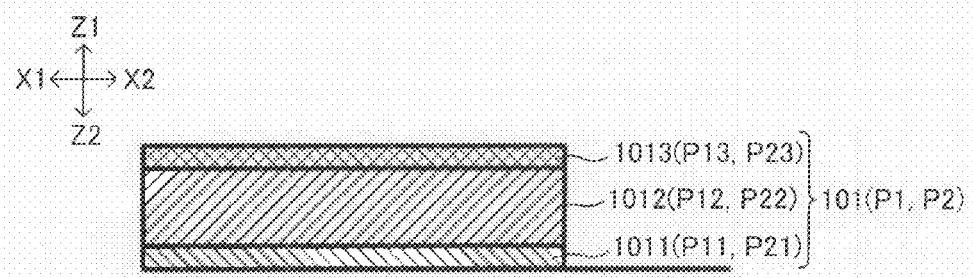
FIG. 5 is a view showing an electrode in a wiring board according to the embodiment of the present invention.

Pads 101 formed on the bottom surface of cavity (R1), pads (P1) formed on a main surface outside cavity (R1) (main surface on the first-surface (F1) side) and pads (P2) formed on the opposite main surface (main surface on the second-surface (F2) side) have anticorrosion layers (1013, P13, P23) respectively as shown in FIG. 5. In particular, pads 101 have a triple-layer structure in which copper foil 1011, plated layer 1012 and anticorrosion layer 1013 are laminated in that order from the lowest layer. Also, portions of conductive patterns (101c) exposed in non-groove section (R12) of connection section (R13) (see FIG. 4) have a triple-layer structure of copper foil 1011, plated layer 1012 and anticorrosion layer 1013. Pads (P1) have a triple-layer structure in which copper foil (P11), plated layer (P12) and anticorrosion layer (P13) are laminated in that order from the lowest layer. Pads (P2) have a triple-layer structure in which copper foil (P21), plated layer (P22) and anticorrosion layer (P23) are laminated in that order from the lowest layer. Anticorrosion layers (1013, P13, P23) are each made of the same material (such as Ni/Au film or OSP film) and are formed by electrolytic plating or OSP treatment or the like. Here, conductive layers (11a, 61, 71) may have an anticorrosion layer only on the exposed surfaces (such as pad surfaces), or they may have an anticorrosion layer on their respective entire surface.

Figure 6A:
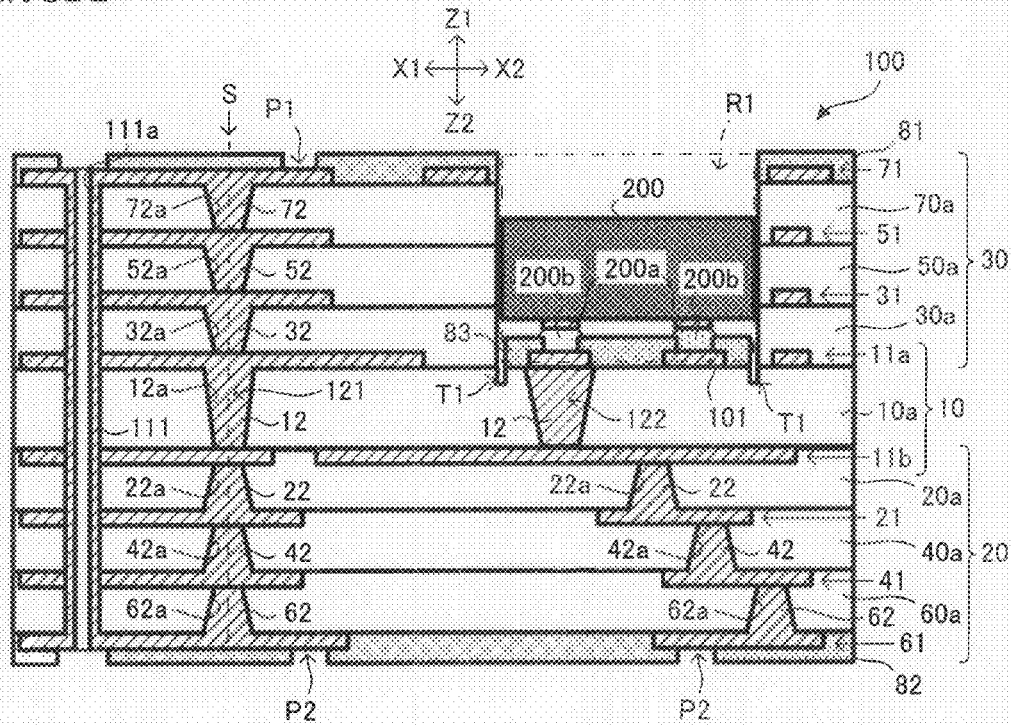
FIG. 6A is a view showing an example in which an electronic component is mounted on a wiring board according to the embodiment of the present invention.

As shown in FIG. 6A, for example, electronic component 200 with electrodes (200a) is accommodated in cavity (R1). In addition, solder (200b) is formed on pads 101 in cavity (R1) (in particular on anticorrosion layer 1013 shown in FIG. 5). Then, pads 101 and electronic component 200 are electrically connected to each other through solder (200b). Here, what is electrically connected to pads 101 is not limited to an electronic component, and may be selected freely (see later-described FIG. 27).

Figure 6B:
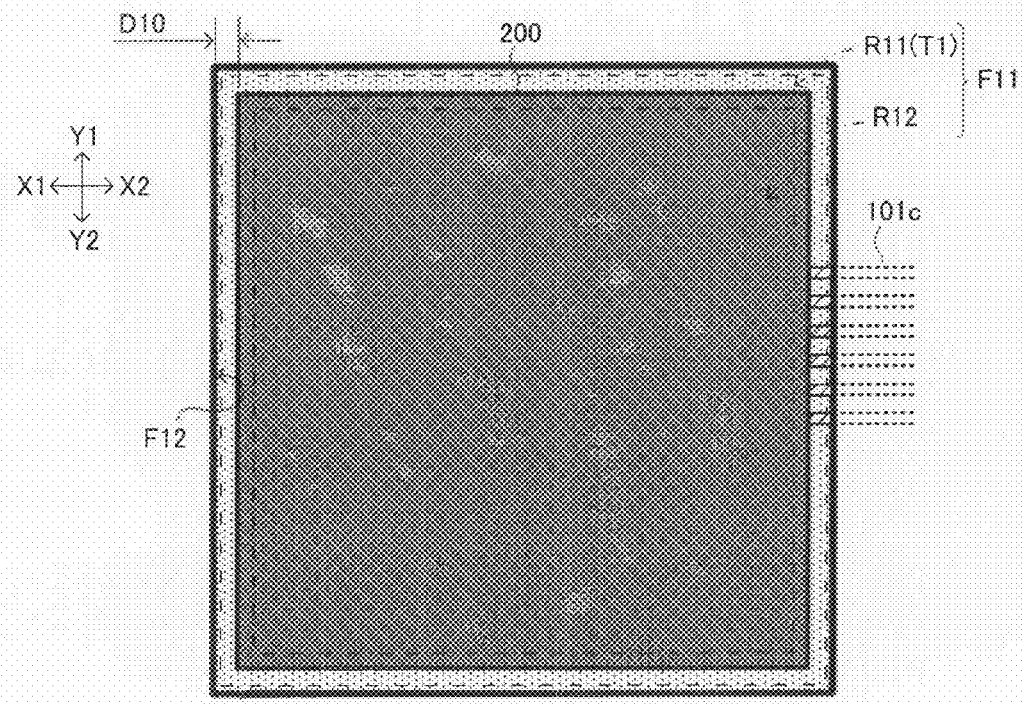
FIG. 6B is a plan view of the wiring board shown in FIG. 6A.

As shown in FIG. 6B, for example, electronic component 200 is positioned so that its side surfaces (all four sides) are entirely positioned on groove section (R11). Space (D10) between wall surfaces (F12) of cavity (R1) and electronic component 200 (½ of clearance) is approximately 20 mm, for example. However, positioning and measurements of electronic component 200 are not limited to such and may be determined freely (see later-described FIG. 26).

According to wiring board 100 of the present embodiment, electrical connection reliability at pads 101 is enhanced without increasing space (D10). As a result, it is easier to reduce space (D10) (or clearance) between wall surfaces (F12) of cavity (R1) and electronic component 200. The reasons for that are described in the following by referring to FIGS. 7A and 7B.

Figure 7A:
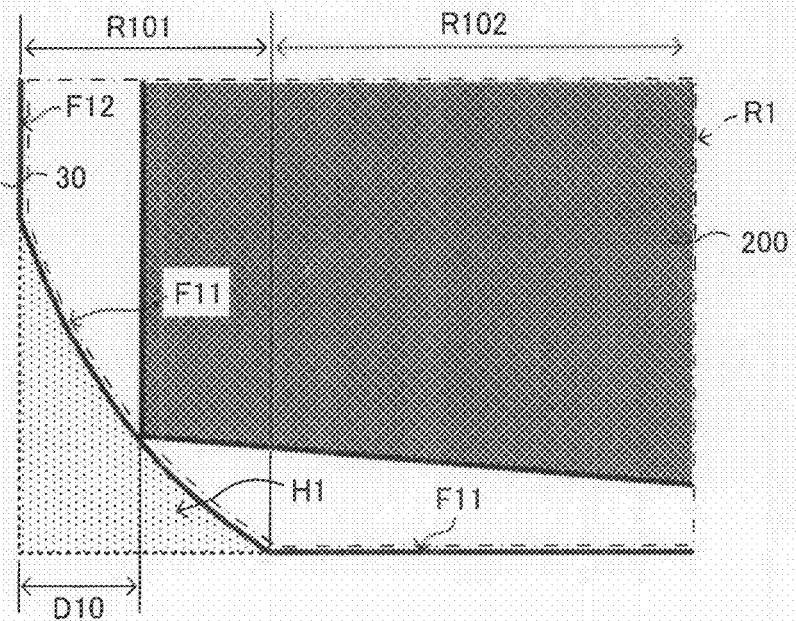
FIG. 7A is a view showing a state in which an electronic component is mounted on a wiring board where no groove is formed on the bottom surface of a cavity.

FIG. 7A shows a wiring board where groove (T1) is not formed on bottom surface (F11) of cavity (R1). As shown in FIG. 7A, skirt portion (H1) tends to be formed by the resin in buildup section 30 being squeezed to the side of cavity (R1) in such a wiring board. Of the entire bottom surface (F11) of cavity (R1), a portion where skirt portion (H1) is formed swells and rises. Hereinafter, of the entire bottom surface (F11) of cavity (R1), the region where skirt portion (H1) is formed is referred to as protruding portion (R101) and the rest is referred to as non-protruding portion (R102).

Since skirt portion (H1) tends to be formed with various heights along wall surfaces (F12) of cavity (R1), the flatness of bottom surface (F11) of cavity (R1) tends to decrease near wall surfaces (F12) of cavity (R1) in a wiring board shown in FIG. 7A. As a result, when mounting electronic component 200 on pads (not shown in the drawing) formed in non-protruding portion (R102) (see pads 101 shown in FIGS. 1 and 2), electronic component 200 makes contact with skirt portion (H1), causing various distances between electronic component 200 and the mounting surface (non-protruding portion R102). Accordingly, there is a concern that electronic component 200 may be mounted while being positioned at an incline. Then, as a result, the electrical connection reliability tends to decrease at the pads formed on bottom surface (F11) of cavity (R1).

To solve the above problems, it may be an option to increase space (D10) (or clearance) between wall surfaces (F12) of cavity (R1) and electronic component 200. However, if space (D10) is increased (namely, cavity (R1) is enlarged), another concern may arise such that the area of the main surface outside cavity (R1) is reduced, and space for forming wiring becomes smaller.

Figure 7B:
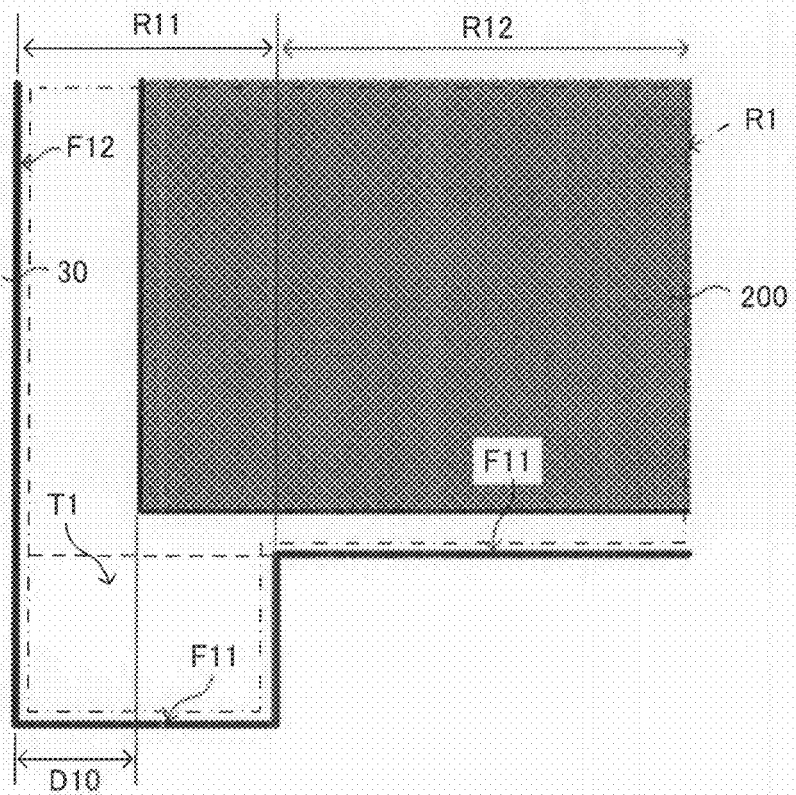
FIG. 7B is a view showing a state in which an electronic component is mounted on a wiring board according to the embodiment of the present invention.

For that matter, in wiring board 100 of the present embodiment shown in FIG. 7B, groove (T1) is formed along wall surfaces (F12) of cavity (R1) on bottom surface (F11) of cavity (R1). Then, pads 101 (see FIGS. 1, 2) are formed in positions (in non-groove section (R12)) on bottom surface (F11) of cavity (R1) which are farther from wall surfaces (F12) than groove (T1) is. More specifically, groove (T1) is formed near wall surfaces (F12) of cavity (R1), and wall surfaces (F12) of cavity (R1) and pads 101 are separated by groove (T1). Accordingly, skirt portion (H1) (protruding portion) is seldom formed near wall surfaces (F12) of cavity (R1), and it is easier to make the distance constant between electronic component 200 and the mounting surface (non-groove section (R12)) as shown in FIG. 7B. As a result, the electrical connection reliability at pads 101 is enhanced. Since space (D10) is not required to be enlarged in such a structure, it is easier to decrease space (D10) (or clearance) between wall surfaces (F12) of cavity (R1) and electronic component 200. As a result, it is easier to ensure space for forming wiring on the main surface outside cavity (R1).

Figure 8:
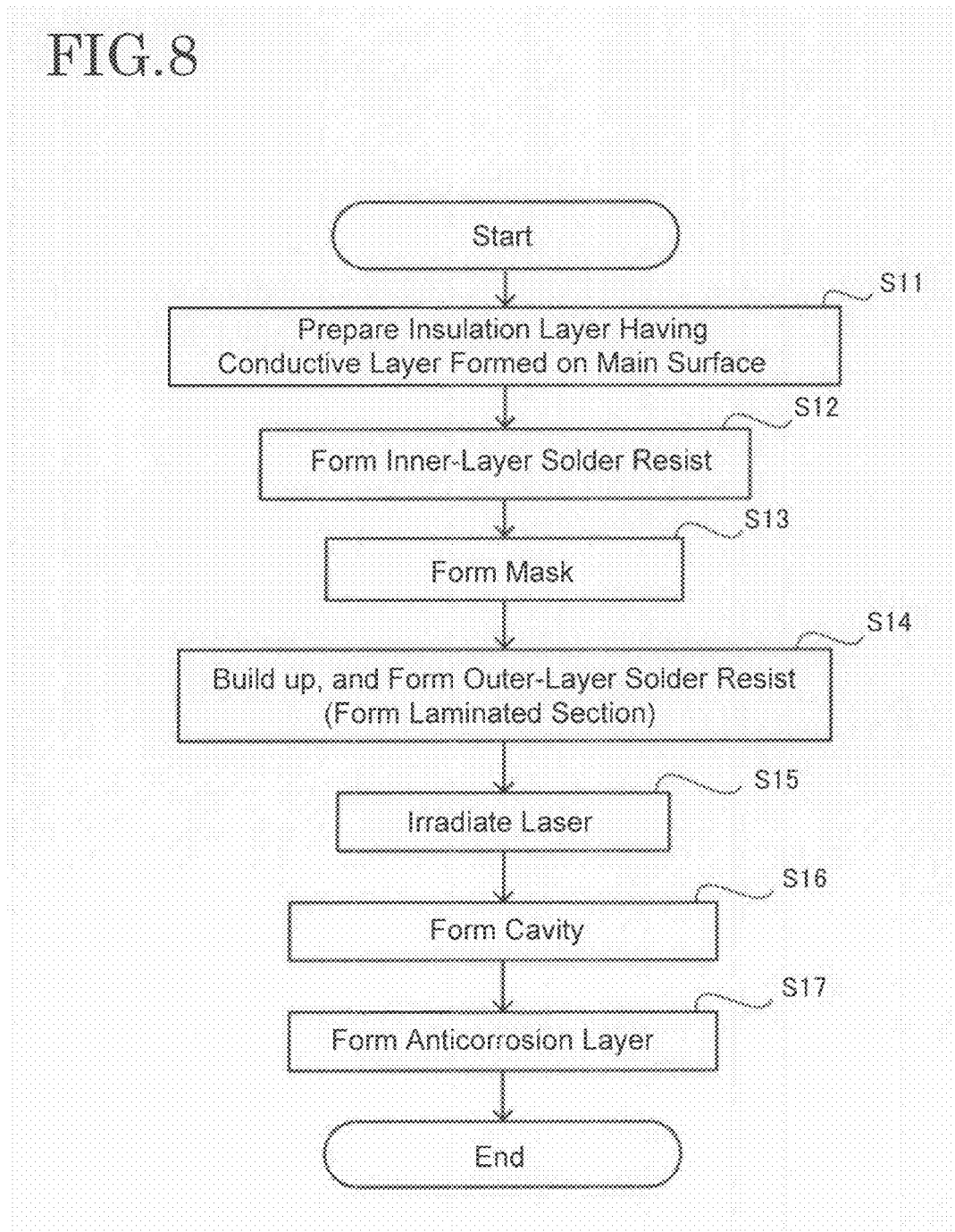
FIG. 8 is a flowchart showing a method for manufacturing a wiring board according to the embodiment of the present invention.
Figure 9:
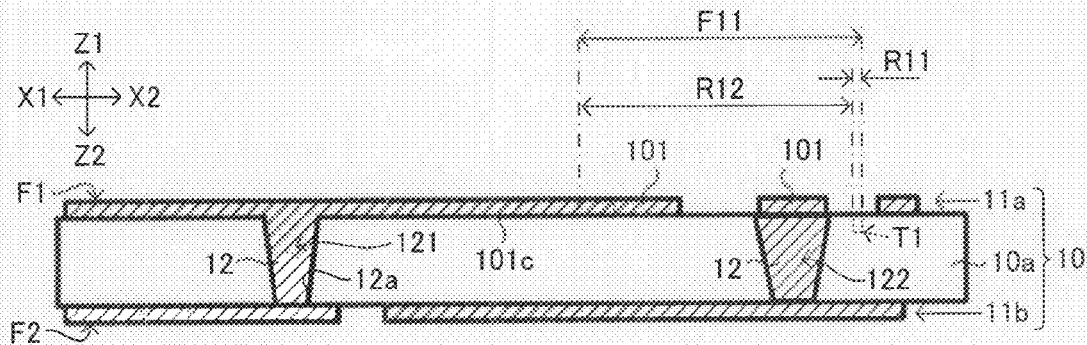
FIG. 9 is a view to illustrate a step for preparing a core substrate (an insulation layer where conductive layers are formed on its main surfaces) in the manufacturing method shown in FIG. 8.

The above wiring board 100 is manufactured by the process shown in FIG. 8, for example.

In step (S11), wiring board 10 is prepared. Wiring board 10 has insulation layer (10a), conductive layers (11a, 11b) and via conductors 12. Via conductors 12 are filled conductors.

Conductive layer (11a) is formed on a main surface of insulation layer (10a) and conductive layer (11b) is formed on the other main surface of insulation layer (10a). However, conductive layer (11a) does not have conductive patterns on the region corresponding to groove section (R11) on the main surface (first surface (F1)) of insulation layer (10a) (see FIG. 3A). As a result, insulation layer (10a) is exposed in the region corresponding to groove section (R11).

For example, wiring board 10 may be formed as follows: using a double-sided copper-clad laminate as a starting material; forming via holes in the laminate by a laser, for example; performing copper panel plating; and patterning conductive layers on both surfaces using lithographic technology, for example. Insulation layer (10a) is made of completely cured glass-epoxy resin, for example.

Figure 10:
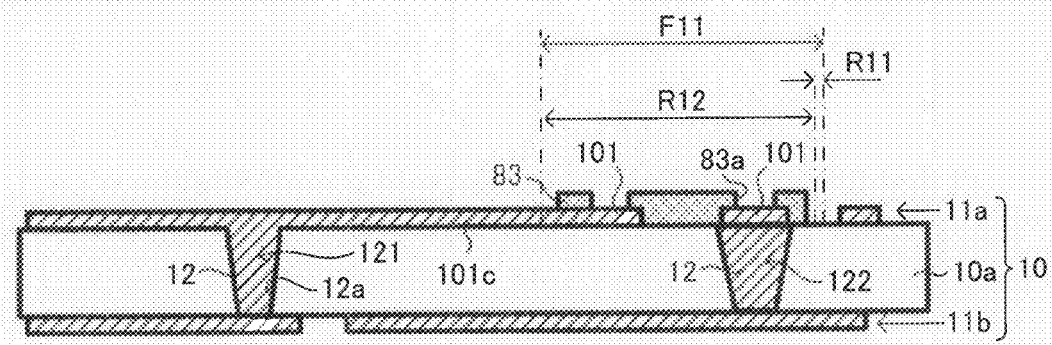
FIG. 10 is a view to illustrate a step for forming inner-layer solder resist in the manufacturing method shown in FIG. 8.

In step (S12) of FIG. 8, solder resist 83 for pads 101 (inner-layer solder resist) is formed on the region corresponding to bottom surface (F11) of cavity (R1) (especially non-groove section (R12)) as shown in FIG. 10, for example. Solder resist 83 may be formed by screen printing, spray coating, roll coating, lamination or the like. Anticorrosion layer 1013 is not formed on pads 101 at this stage. In the present embodiment, anticorrosion layer 1013 of pads 101 is formed simultaneously with anticorrosion layers (P13, P23) of pads (P1, P2). By doing so, manufacturing efficiency is improved.

Figure 11:
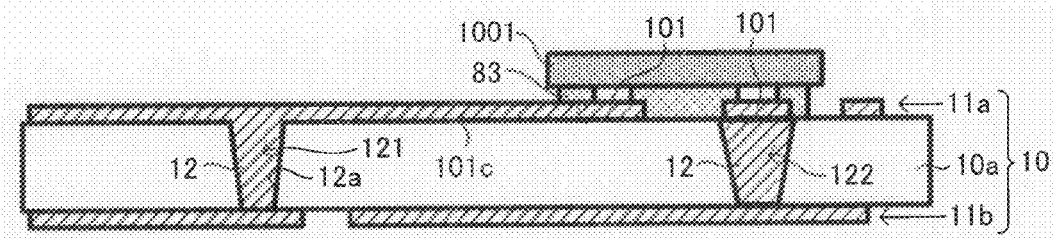
FIG. 11 is a view to illustrate a step for forming a mask in the manufacturing method shown in FIG. 8.

In step (S13) of FIG. 8, mask 1001 is formed on solder resist 83 as shown in FIG. 11, for example. Mask 1001 has substantially the same outer shape (on the X-Y plane) as that of solder resist 83, for example.

In step (S14) of FIG. 8, outer-layer solder resists are formed after buildup is performed on both surfaces of wiring board 10. Accordingly, buildup sections (30, 20) are formed respectively on first surface (F1) and second surface (F2) of wiring board 10.

Figure 12A:
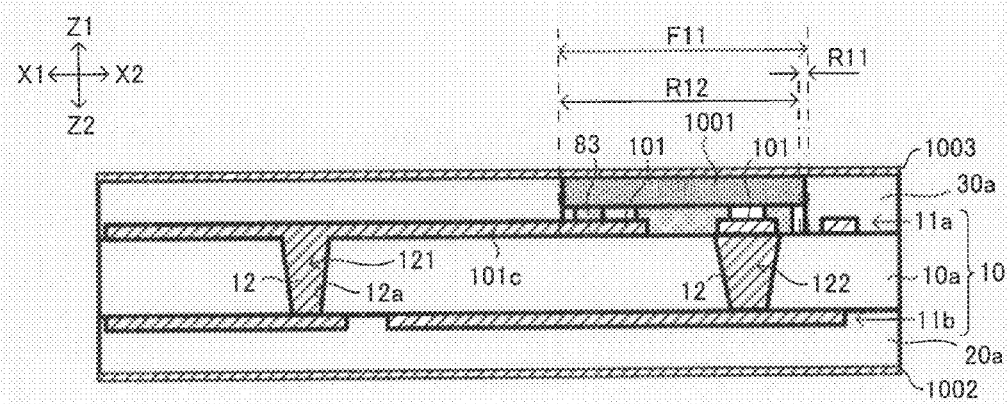
FIG. 12A is a view to illustrate a first step for buildup in the manufacturing method shown in FIG. 8.

More specifically, after mask 1001 is formed, copper foil 1002, insulation layer (20a), wiring board 10, insulation layer (30a) and copper foil 1003 are positioned in that order from the second-surface (F2) side as shown in FIG. 12A, for example. Here, by positioning insulation layer (30a) on the sides of mask 1001 and by making the height of insulation layer (30a) substantially the same as the height of mask 1001, a substantially flat surface is formed by their main surfaces. Then, copper foil 1003 is formed on the substantially flat surface. Wiring board 10 is sandwiched by insulation layers (20a, 30a), which are then sandwiched by copper foil 1002 and copper foil 1003. At this stage, insulation layers (20a, 30a) are prepreg (semi-cured adhesive sheets). However, RCF (resin-coated copper foil) or the like may also be used instead of prepreg.

The above laminate is thermal pressed in directions Z. Namely, pressing and heating are simultaneously performed. Prepreg (insulation layers (20a, 30a)) is cured through pressing and heating, and the members are adhered to each other. As a result, the laminate becomes integrated. Pressing and heating may be divided into multiple procedures. Also, heating and pressing may be conducted separately, but it is more efficient if they are conducted at the same time. After thermal pressing, another round of heating for integration may be conducted.

Figure 12B:
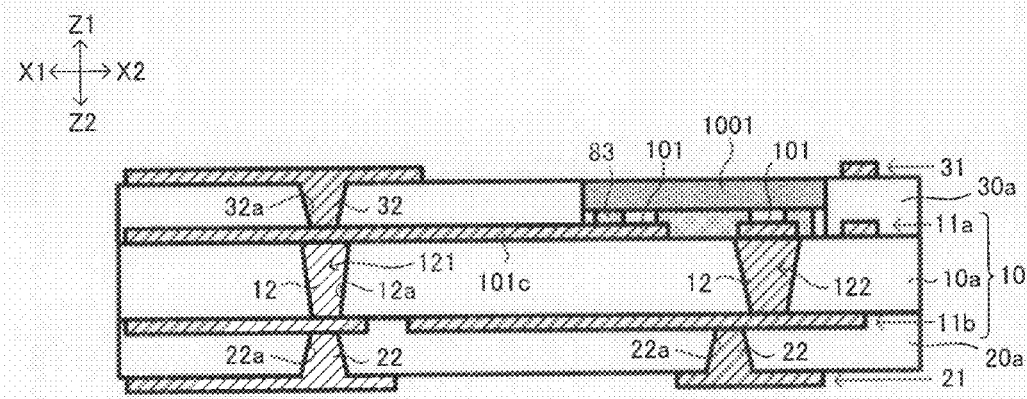
FIG. 12B is a view to illustrate a second step for buildup in the manufacturing method shown in FIG. 8.

Via holes (22a) are formed in insulation layer (20a) and via holes (32a) are formed in insulation layer (30a) by using a laser, for example (see FIG. 12B). Then, desmearing is conducted if required.

After plating is formed on copper foils (1002, 1003) and in via holes (22a, 32a) by conducting copper panel plating, for example, conductive layers on both surfaces are patterned using lithographic technology, for example. Accordingly, via conductors (22, 32) and conductive layers (21, 31) are formed as shown in FIG. 12B. Conductive layer 31 does not have conductive patterns directly on (in direction Z) the region corresponding to groove section (R11). Each of via conductors (22, 32) is a filled conductor and is stacked directly on (in direction Z) via conductor 12.

Figure 13:
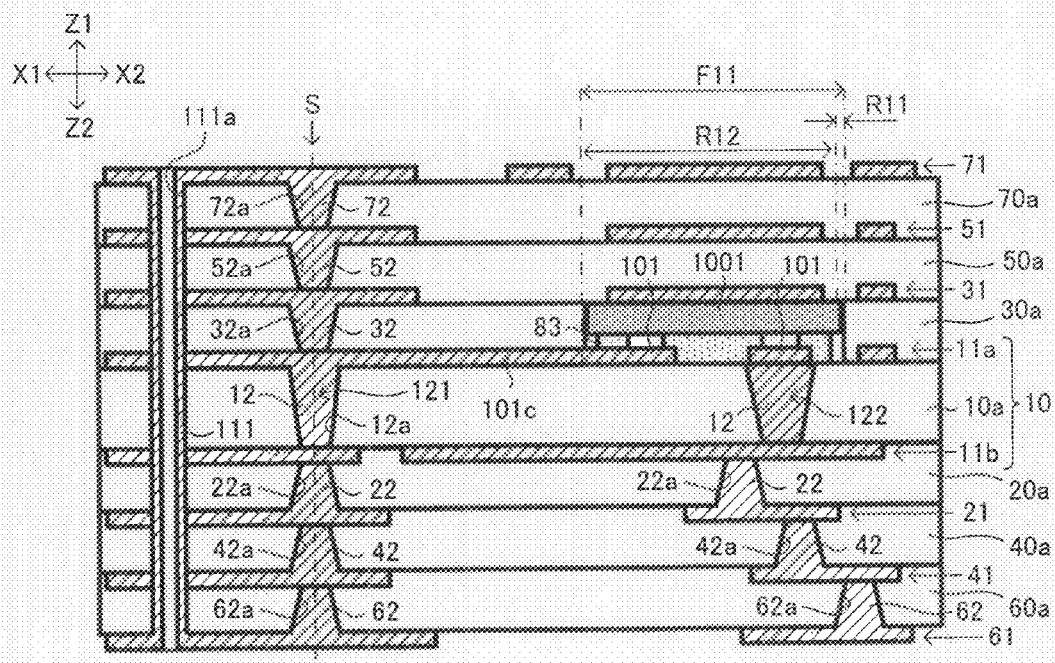
FIG. 13 is a view to illustrate a third step for buildup in the manufacturing method shown in FIG. 8.

The same as in first buildup layers (insulation layers (20a, 30a), conductive layers (21, 31) and via conductors (22, 32)), second buildup layers (insulation layers (40a, 50a), conductive layers (41, 51) and via conductors (42, 52)) and third buildup layers (insulation layers (60a, 70a), conductive layers (61, 71) and via conductors (62, 72)) are formed in that order as shown in FIG. 13. However, prior to panel plating for forming conductive layers (61, 71), through holes (111a) are formed. Accordingly, through-hole conductors 111 are formed on wall surfaces of through holes (111a) by the subsequent panel plating.

Conductive layers (51, 71) do not have conductive patterns directly on (in direction Z) the region corresponding to groove section (R11). Namely, there is no conductor (especially metal which easily reflects laser light) directly on (in direction Z) the region corresponding to groove section (R11). In addition, each of via conductors (42, 52, 62, 72) is a filled conductor and is stacked directly on (in direction Z) via conductor 12. They form a filled-stack structure.

Figure 14:
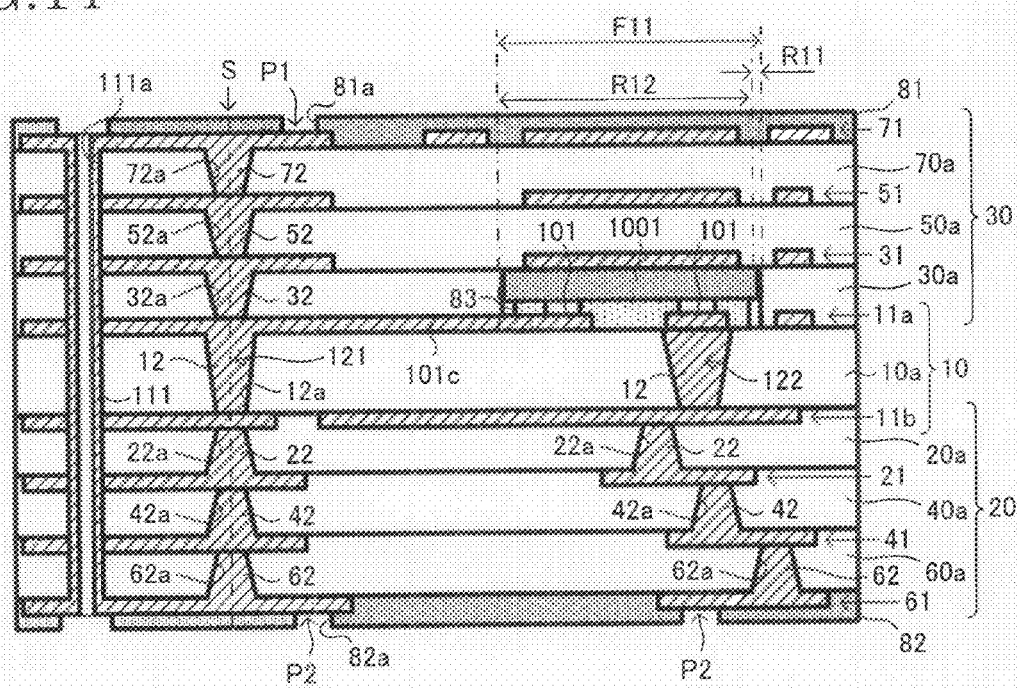
FIG. 14 is a view to illustrate a step for forming outer-layer solder resists in the manufacturing method shown in FIG. 8.

As shown in FIG. 14, solder resist 81 having opening portions (81a) and solder resist 82 having opening portions (82a) are formed respectively on insulation layers (70a, 60a). Conductive layers (71, 61) are covered with solder resists (81, 82) except for predetermined spots positioned at opening portions (81a, 82a) (pads (P1, P2), lands and the like). Solder resists (81, 82) are formed by screen printing, spray coating, roll coating, lamination or the like, for example. Pads (P1, P2) do not have anticorrosion layers (P13, P23) at this stage.

As described above, on first surface (F1) of wiring board 10 (on insulation layer (10a) and on conductive layer (11a)), buildup section 30 is formed with insulation layers (30a, 50a, 70a) and solder resist 81; and on second surface (F2) of wiring board 10 (on insulation layer (10a) and on conductive layer (11b)), buildup section 20 is formed with insulation layers (20a, 40a, 60a) and solder resist 82.

In step (S15) of FIG. 8, laser light is irradiated at groove section (R11) from the upper-layer side of buildup section 30.

Figure 15A:
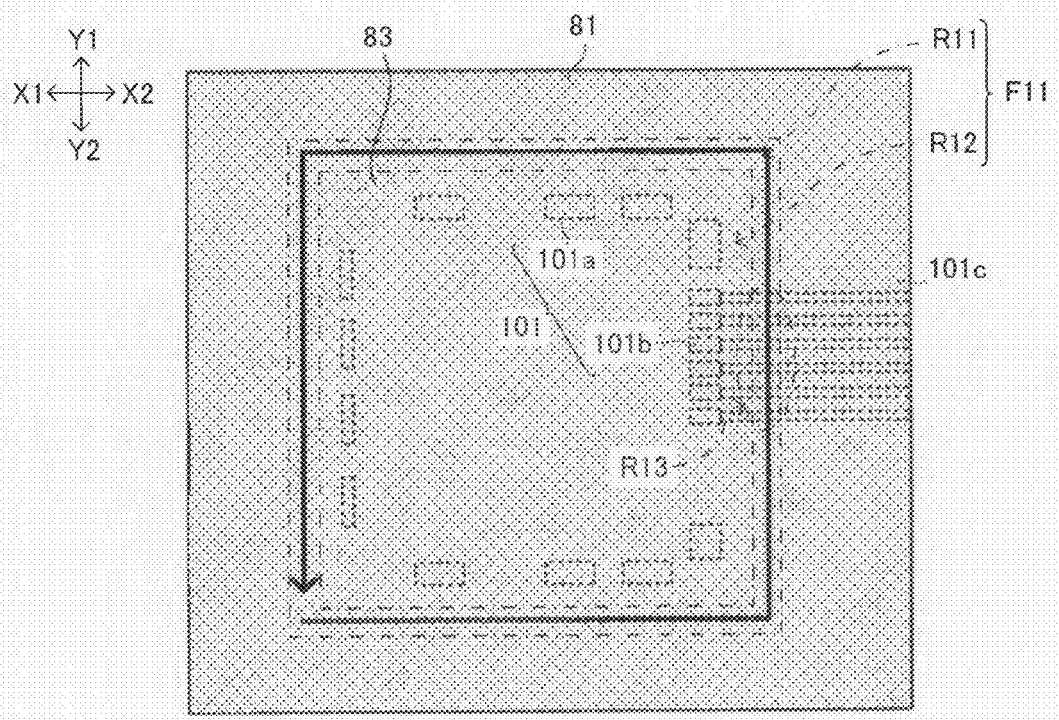
FIG. 15A is a view to illustrate a step for irradiating a laser in the manufacturing method shown in FIG. 8.

In particular, as shown in FIG. 15A, for example, laser light is irradiated in the way that a rectangle is drawn, and part of buildup section 30 is cut out from its surrounding portions. During that time, irradiation conditions of the laser light (such as intensity) are adjusted so that laser light reaches insulation layer (10a) and groove (T1) is obtained having a required depth. The irradiation angle of the laser light is set to be substantially perpendicular to first surface (F1) of wiring board 10, for example.

When changing irradiation spots of a laser, for example, it is preferred that the object to be irradiated be fixed and the laser (in particular its aiming point) be moved; alternatively, it is preferred that the laser (in particular its aiming point) be fixed and the object be moved. When the laser is moved, it is preferred to use a galvanometer mirror, for example.

Figure 15B:
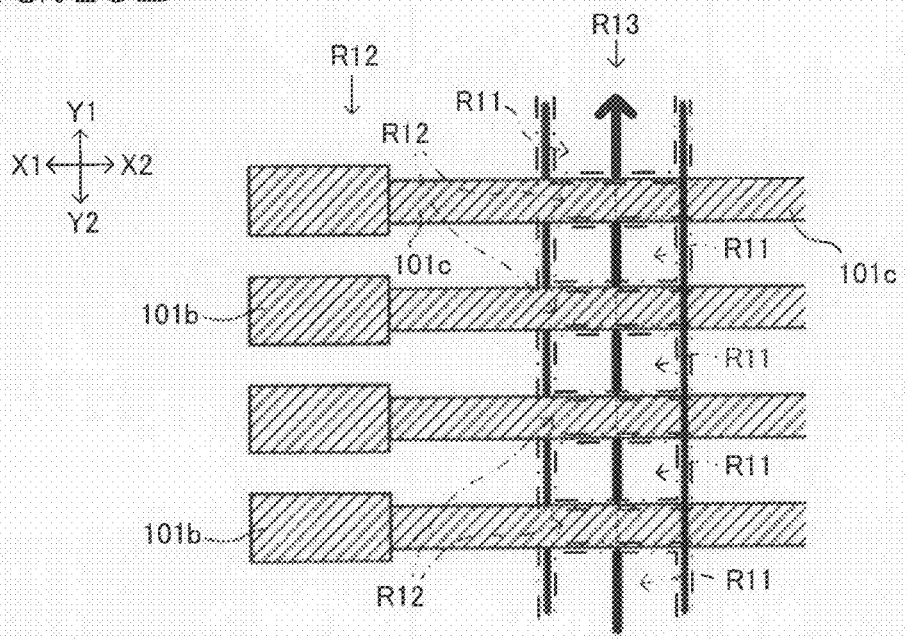
FIG. 15B is a magnified view of the connection section during the step for irradiating a laser in the manufacturing method shown in FIG. 8.

In connection section (R13), multiple conductive patterns (101c) are each formed to cross groove (T1), and a laser is irradiated so that portions of groove (T1) and conductive patterns (101c) are alternately positioned as shown in FIG. 15B.

Here, groove (T1) is formed continuously except in connection section (R13). Furthermore, as shown in FIG. 15B, groove (T1) is formed so as to be positioned between conductive patterns (101c) made of metal (copper in the present embodiment) in connection section (R13). Since metal easily reflects laser light, in the present embodiment, groove (T1) is formed by conducting maskless laser irradiation without pausing the irradiation at connection section (R13). However, when groove (T1) is formed intermittently in connection section (R13), it is preferred to set the intensity of the laser light less than when forming groove (T1) continuously (laser irradiation at portions except for connection section (R13)). In doing so, damage from laser irradiation to conductive patterns (101c) tends to be reduced. When irradiating laser light at connection section (R13), it is preferred to precisely adjust the intensity (power adjustment) of the laser light.

In the present embodiment, the above laser irradiation is conducted maskless without pausing irradiation. However, laser irradiation is not limited to such. For example, laser light may be irradiated at the entire surface of the object using a shielding mask having openings only at irradiation spots; or laser light may be irradiated at portions to be irradiated without using a mask by pausing laser irradiation at portions not to be irradiated.

In addition, laser intensity (the amount of light) is preferred to be adjusted by pulse control. Specifically, for example, to modify laser intensity, the number of shots (irradiation number) is changed without changing laser intensity per shot (one irradiation). Namely, if the required laser intensity is not obtained with one shot, laser light is irradiated again at the same irradiation spot. If such a control method is used, the throughput improves since time for modifying irradiation conditions is omitted. However, adjusting laser intensity is not limited to the above, and any other method may be taken. For example, irradiation conditions may be determined for each irradiation spot, while the irradiation number is set constant (for example, one shot per one irradiation spot).

Figure 16:
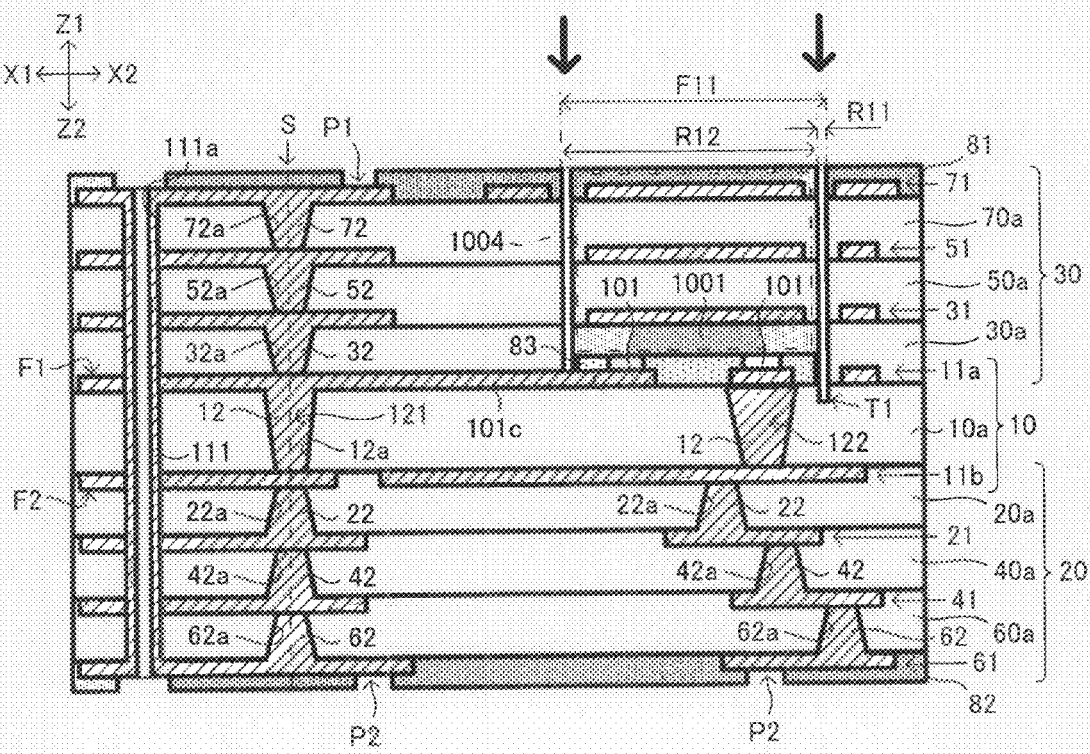
FIG. 16 is a view showing a groove formed by irradiating a laser in the manufacturing method shown in FIG. 8.

By the above laser irradiation, part of buildup section 30 (mask 1001 and the portion above it) becomes separable while groove (T1) is formed in first surface (F1) of wiring board 10 (a main surface of insulation layer (10a) in particular) as shown in FIG. 16. Hereinafter, the separable portion of buildup section 30 is referred to as cover portion 1004. In the present embodiment, buildup section 30 is cut relatively easily by using a laser. Therefore, even if buildup section 30 is thick, or if buildup section 30 is formed as multilayer, groove (T1) tends to be formed easily.

Figure 17:
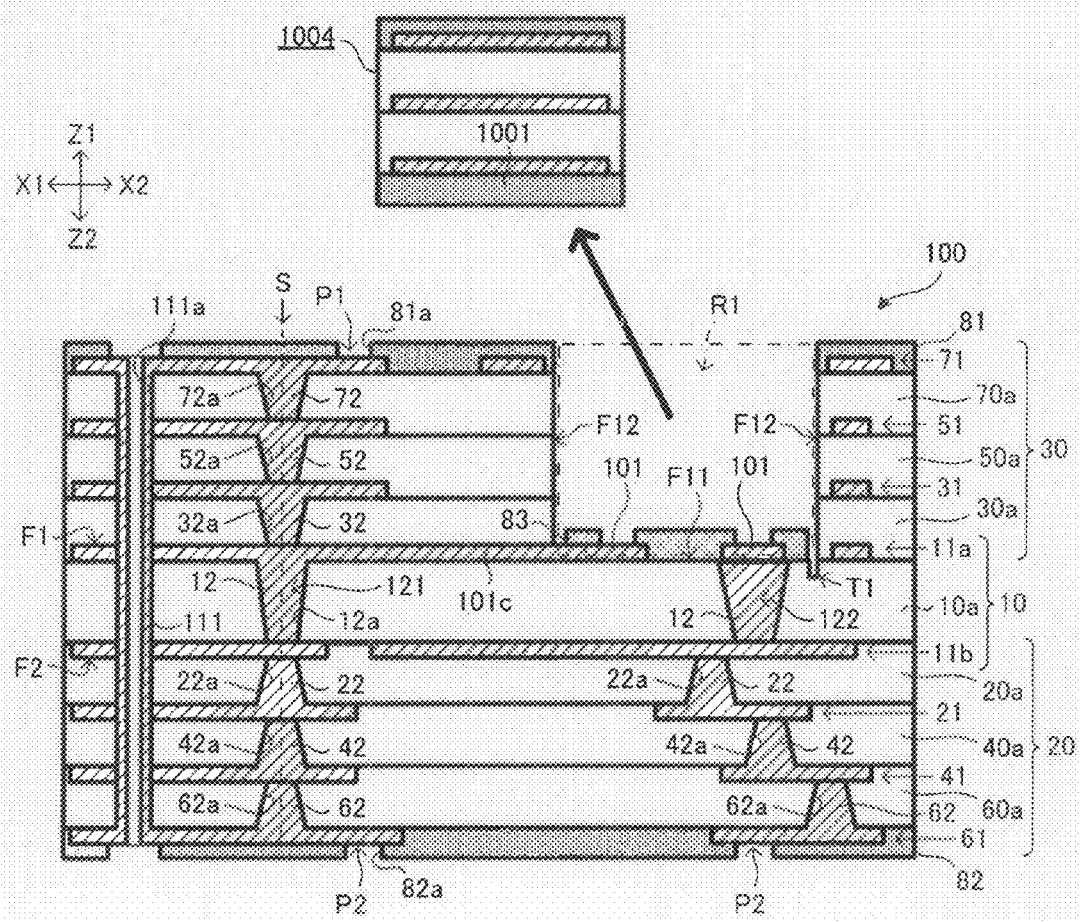
FIG. 17 is a view to illustrate a step for forming a cavity in the manufacturing method shown in FIG. 8.

In step (S16) of FIG. 8, cover portion 1004 of buildup section 30 is removed as shown in FIG. 17 by adding external force manually or using other methods, for example. Accordingly, cavity (R1) is formed to have a surface (first surface F1) of insulation layer (10a), where pads 101 and groove (T1) are formed, as its bottom surface (F11). Also, groove (T1) is formed along wall surfaces (F12) of cavity (R1). In addition, pads 101 are positioned farther from wall surfaces (F12) than groove (T1) is.

In step (S17) of FIG. 8, anticorrosion layers (1013, P13, P23) (see FIG. 5) made of Ni/Au film, for example, are formed on each exposed surface (such as a pad surface) through electrolytic plating, sputtering or the like. Alternatively, anticorrosion layers (1013, P13, P23) made of an organic solderability preservative may be formed through OSP treatment. Accordingly, pads 101 having anticorrosion layer 1013 on their surfaces and pads (P1, P2) respectively having anticorrosion layers (P13, P23) on their surfaces are formed as shown in FIGS. 1 and 5. Also, anticorrosion layer 1013 (see FIG. 5) is formed partially on surfaces of conductive patterns (101c) (see FIG. 4), which are exposed in non-groove section (R12) of connection section (R13).

Wiring board 100 (FIGS. 1, 2) is completed by the steps described above. The manufacturing method according to the present embodiment is preferable for manufacturing wiring board 100. An excellent wiring board 100 is obtained at low cost according to such a manufacturing method.

So far, a wiring board and its manufacturing method according to an embodiment of the present invention have been described. However, the present invention is not limited to the above embodiment.

The shape of cavity (R1) is not limited to being substantially rectangular, and any other shape may be employed. For example, as shown in FIG. 18, cavity (R1) may be shaped to be substantially columnar.

Figure 18:
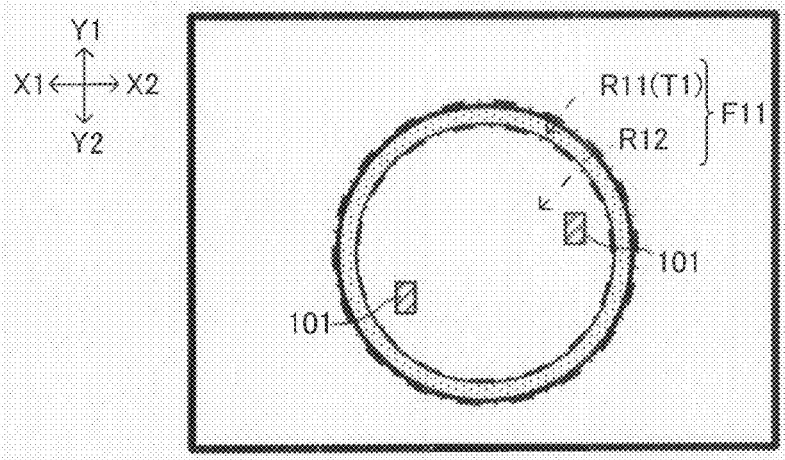
FIG. 18 is a view showing a cavity shaped differently in a wiring board according to the embodiment of the present invention.

Groove (T1) may be formed continuously without any break as shown in FIG. 18, for example. In such a case, non-groove section (R12) is a region surrounded completely by ring-shaped groove (T1), which does not have any break.

In the example in FIG. 18, pads 101 are positioned in non-groove section (R12) (partial region of bottom surface (F11)) surrounded by groove (T1).

Figure 19:
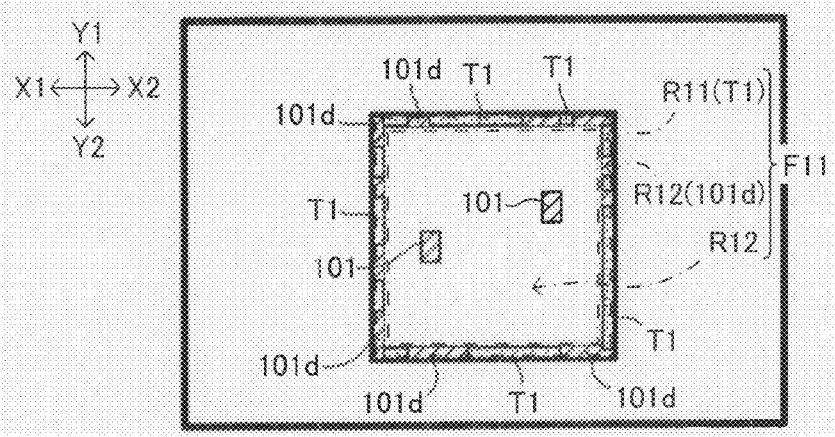
FIG. 19 is a view showing an alternative example in which a groove is formed intermittently in a wiring board according to the embodiment of the present invention.

Alternatively, as shown in FIG. 19, for example, non-groove section (R12) may be surrounded by groove (T1) which is formed with a broken line. Such broken-line groove (T1) may be easily formed as follows: prior to laser irradiation for forming groove (T1), stoppers (101d) (such as conductive patterns made of metal) that reflect a laser are formed in non-groove section (R12) between portions of groove (T1), for example. Stoppers (101d) may be such conductive patterns that do not form circuits, or may be conductive patterns that form circuits (such as part of wiring). In the example in FIG. 19, non-groove section (R12) (stoppers 101d) is formed to be a broken line. In addition, pads 101 are positioned in non-groove section (R12) surrounded by groove (T1) (partial region of bottom surface (F11)).

Figure 20:
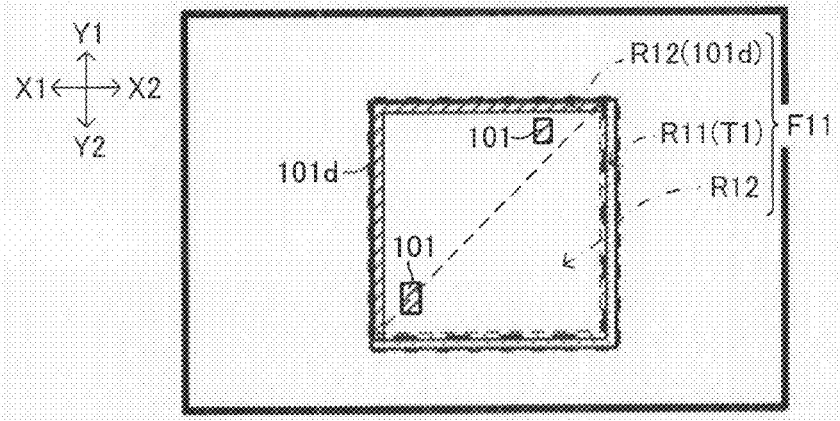
FIG. 20 is a view showing yet another alternative example in which a groove is formed only along portions of the wall surfaces of a cavity in a wiring board according to the embodiment of the present invention.

In the above embodiment, groove (T1) is formed on bottom surface (F11) of cavity (R1) along substantially all wall surfaces (F12) of cavity (R1) (see FIG. 3A). However, the above embodiment is not limited to such; for example, as shown in FIG. 20, groove (T1) may be formed only along part of wall surfaces (F12) of cavity (R1) (for example, along two sides). As in the case of the above broken-line groove (T1) (FIG. 19), such groove (T1) may also be easily formed, for example, by forming stoppers (101d) (such as conductive patterns made of metal) in the region where groove (T1) is not formed (non-groove section (R12)) prior to laser irradiation for forming groove (T1).

Figure 21:
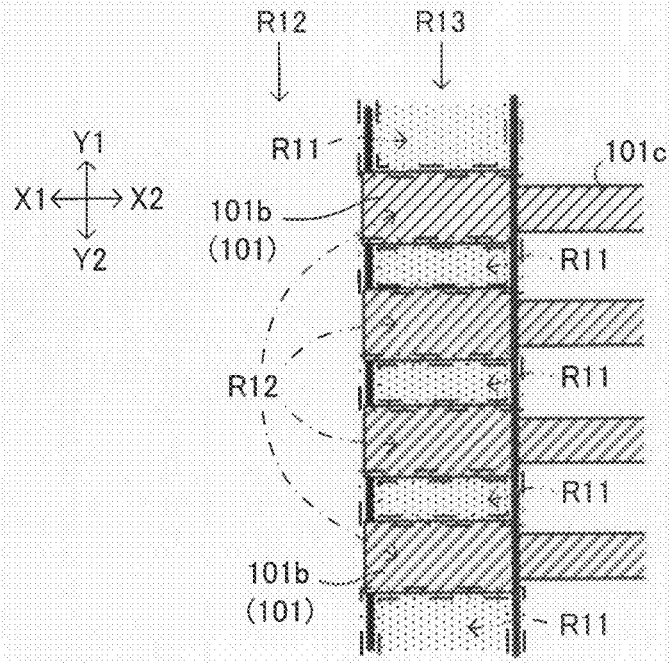
FIG. 21 is a view showing yet another alternative example in which a pad is positioned in a portion corresponding to a break in the ring formed by a groove in a wiring board according to the embodiment of the present invention.

As shown in FIG. 20, pads 101 may be positioned outside the region surrounded by groove (T1) (the region shown by a broken line in FIG. 20). In addition, as shown in FIG. 21, pads (101b) electrically connected to conductive patterns (101c) may be positioned in portions corresponding to breaks in the ring that are formed by groove (T1). In such a case, without solder resist being formed between pads (101b) (see FIG. 4), short circuiting caused by a solder bridge is prevented by groove (T1) between pads (101b).

Figure 22:
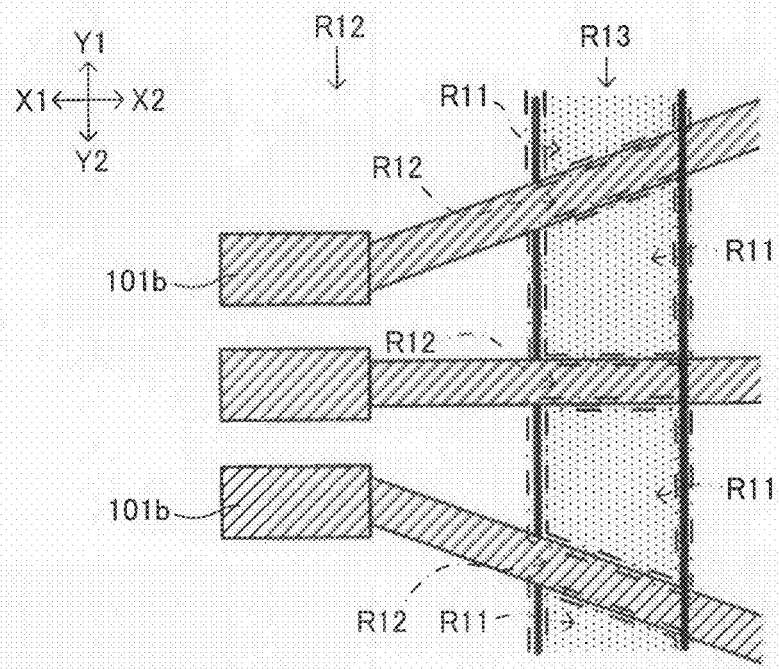
FIG. 22 is a view showing yet another alternative example in which the angle between a groove and a conductive pattern in the connection section is either acute or obtuse in a wiring board according to the embodiment of the present invention.

The angle made by groove (T1) and conductive pattern (101c) in connection section (R13) is not limited to approximately 90 degrees; for example, the angle may be acute or obtuse as shown in FIG. 22.

Figure 23A:
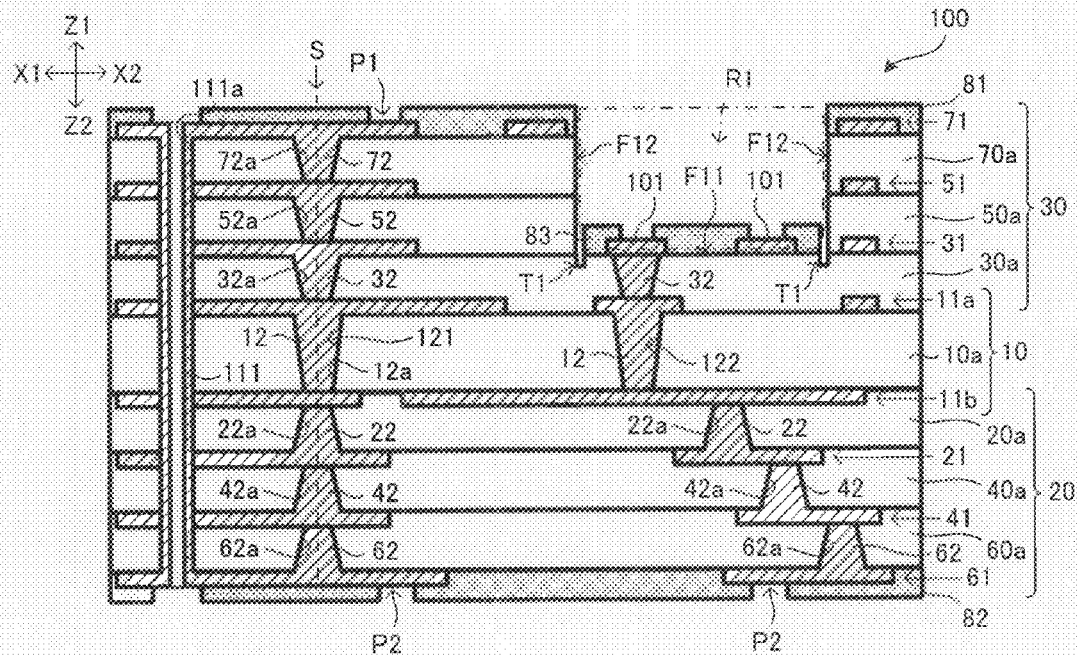
FIG. 23A is a view showing a first alternative example in which the depth of a cavity is different in a wiring board according to the embodiment of the present invention.
Figure 23B:
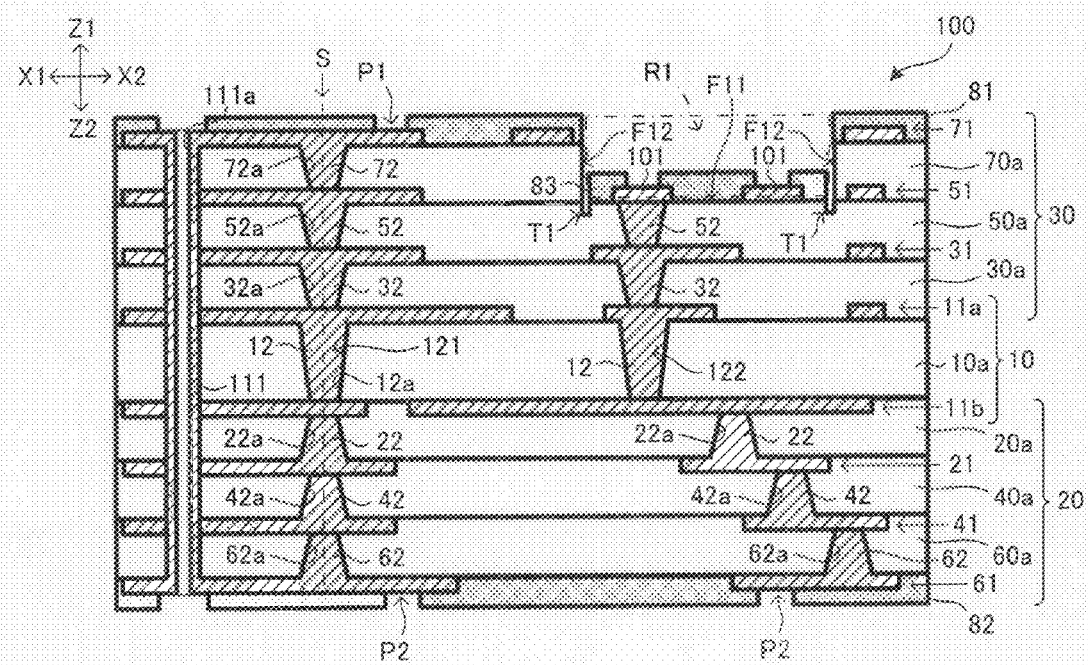
FIG. 23B is a view showing a second alternative example in which the depth of a cavity is different in a wiring board according to the embodiment of the present invention.

In the above embodiment, cavity (R1) penetrates through buildup section 30. However, cavity (R1) is not limited to such and may also be an opening portion that does not penetrate through buildup section 30. For example, as shown in FIG. 23A, bottom surface (F11) of cavity (R1) may be a main surface of insulation layer (30a). Alternatively, as shown in FIG. 23B, for example, bottom surface (F11) of cavity (R1) may be a main surface of insulation layer (50a). Yet alternatively, as shown in FIG. 23A or 23B, pads 101 in cavity (R1) may be electrically connected to via conductors (via conductors 122, 32 or via conductors 122, 32, 52) that form a stack structure.

Figure 24A:
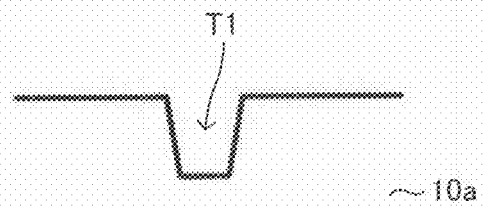
FIG. 24A is a view showing a first alternative example in which a groove has a different cross-sectional shape in a wiring board according to the embodiment of the present invention.
Figure 24B:
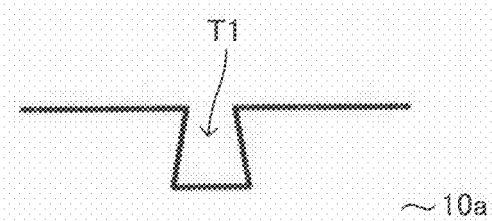
FIG. 24B is a view showing a second alternative example in which a groove has a different cross-sectional shape in a wiring board according to the embodiment of the present invention.
Figure 24C:
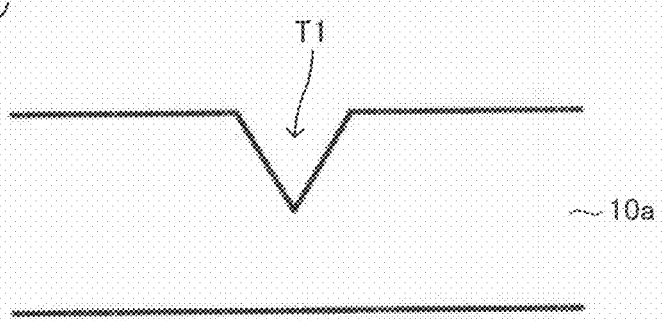
FIG. 24C is a view showing a third alternative example in which a groove has a different cross-sectional shape in a wiring board according to the embodiment of the present invention.
Figure 24D:
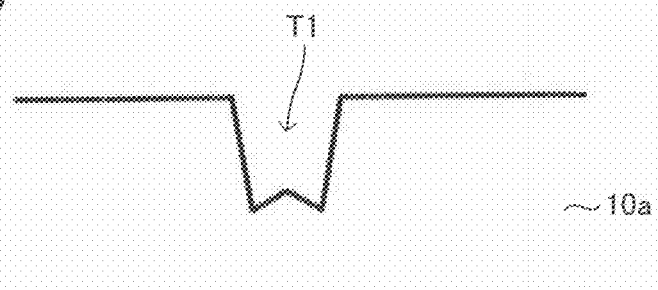
FIG. 24D is a view showing a fourth alternative example in which a groove has a different cross-sectional shape in a wiring board according to the embodiment of the present invention.

The shape of a cross section of groove (T1) (the cross section perpendicular to a longitudinal direction) is not limited to a rectangle whose corners are at substantially right angles, and any other shape may be employed. For example, the shape of a cross section of groove (T1) may be substantially trapezoidal having a width that decreases the deeper it goes as shown in FIG. 24A, or may be substantially trapezoidal having a width that increases the deeper it goes as shown in FIG. 24B. Alternatively, the shape of a cross section of groove (T1) may be in a substantially V shape as shown in FIG. 24C, or substantially in a W shape as shown in FIG. 24D.

Figure 25:
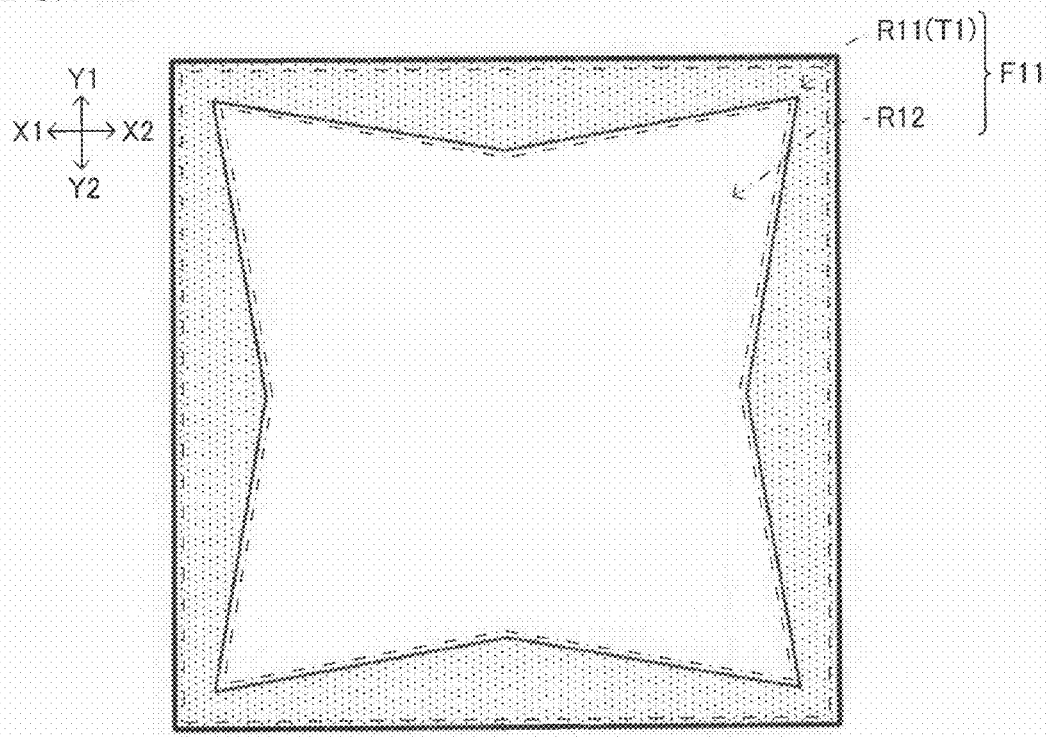
FIG. 25 is a view showing an alternative example in which a groove has a different planar shape in a wiring board according to the embodiment of the present invention.

The planar shape of groove (T1) (on the X-Y plane) according to the present embodiment is not limited to a straight shape having a substantially constant width, and any other shape may be employed. For example, as shown in FIG. 25, the planar shape of groove (T1) may be a straight shape having irregular width.

Figure 26:
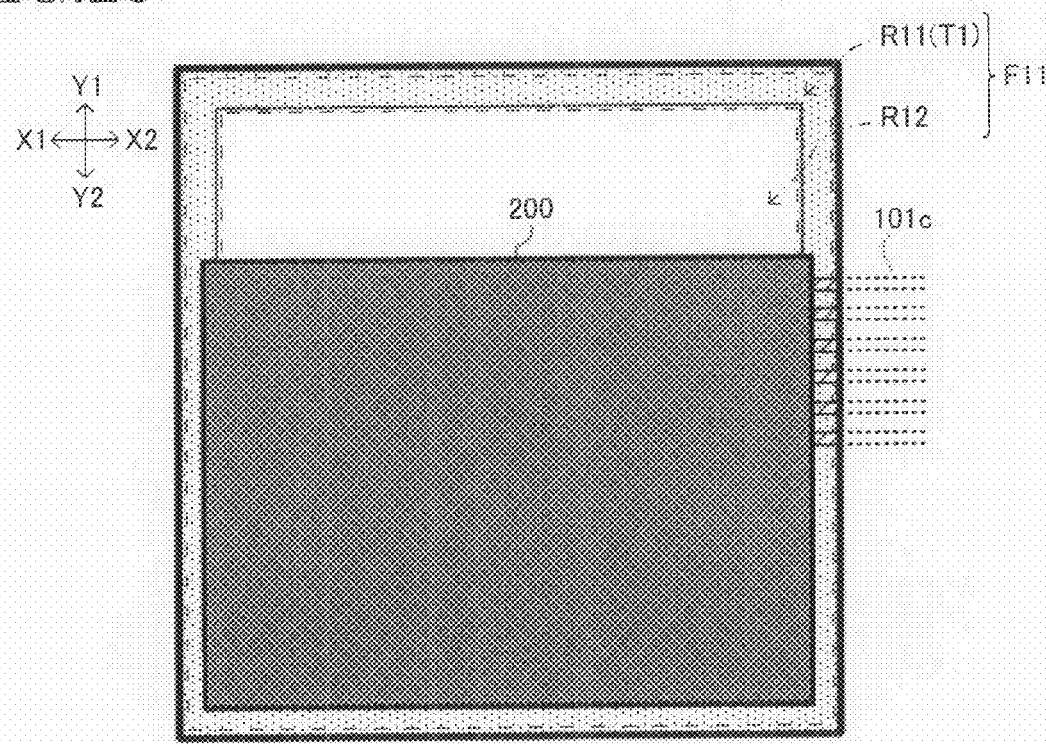
FIG. 26 is a view showing an alternative example in which an electronic component is mounted in a different way in a wiring board according to the embodiment of the present invention.

It is not always required for the entire side surface (all four sides) of electronic component 200 to be positioned in groove section (R11). For example, as shown in FIG. 26, it is possible for only part of the side surfaces of electronic component 200 (for example, three sides) to be positioned in groove section (R11).

Figure 27:
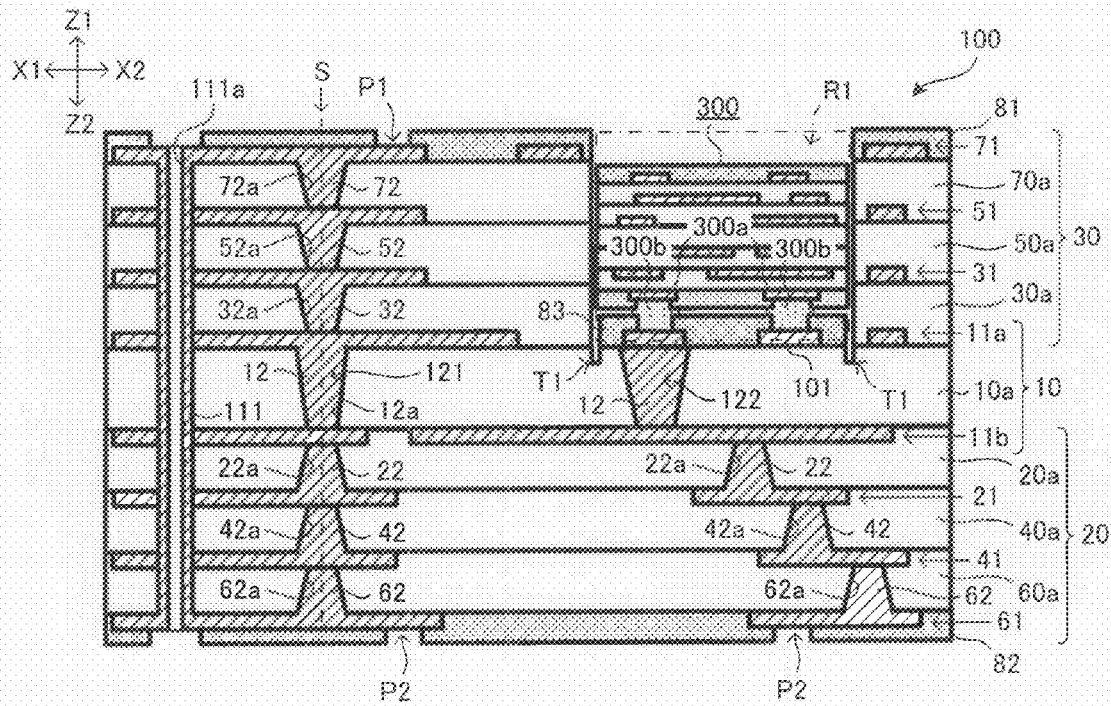
FIG. 27 is a view showing another alternative example in which a wiring board instead of an electronic component is mounted in a wiring board according to the embodiment of the present invention.

What is electrically connected to pads 101 is not limited to electronic component 200 (FIG. 6A), and it may be another wiring board 300 as shown in FIG. 27, for example. In the example in FIG. 27, wiring board 300 is accommodated in cavity (R1), and external connection terminals (300a) of wiring board 300 are electrically connected to pads 101 through solder (300b). Conductors in wiring board 300 are preferred to be set at a higher density than in wiring board 100 by, for example, arranging finer conductive patterns in each conductive layer or by decreasing the thickness of the interlayer insulation layer between conductive layers.

The method for mounting electronic component 200 or the like to be accommodated in cavity (R1) is not limited to solder connections, but any other method may be employed. For example, other methods such as a wire bonding connection or an ACF (anisotropic conductive film) connection may also be used.

Regarding other factors, the structure of wiring board 100 and the type, performance, dimensions, quality, shape, number of layers, positioning and so forth of the elements of such a structure, may be modified freely within a scope that does not deviate from the gist of the present invention.

Figure 28:
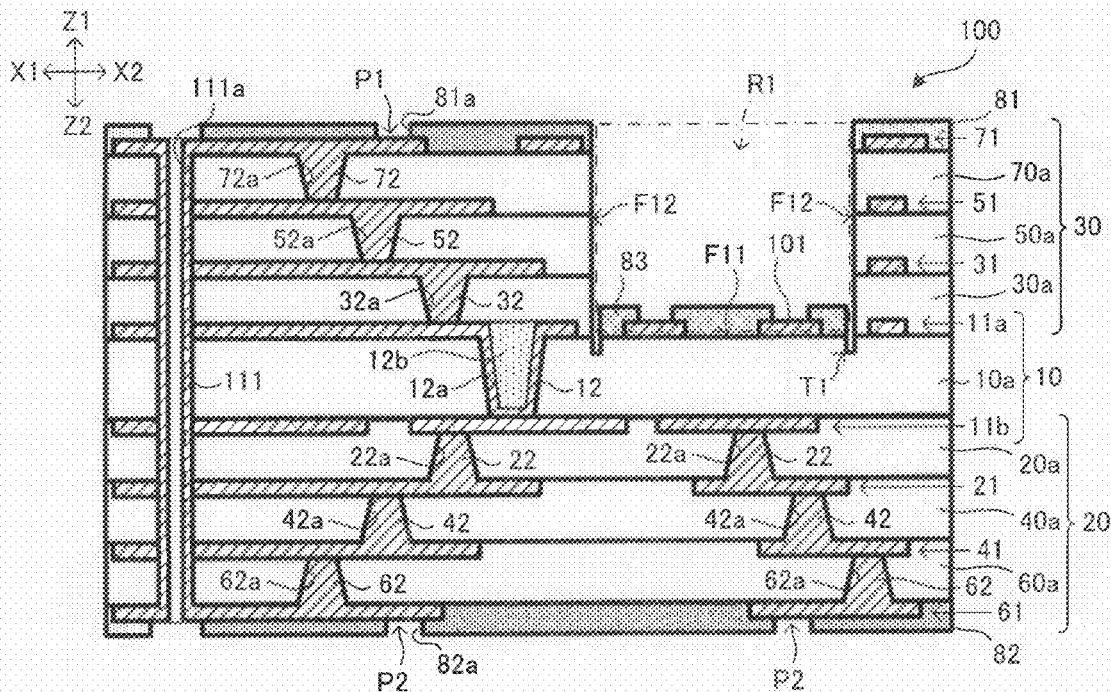
FIG. 28 is a view showing a wiring board according to another embodiment of the present invention where the terminal pitch of the pads formed on the bottom surface of a cavity is widened toward the outer layer.

For example, as shown in FIG. 28, a wiring board may be formed without filled-stack structure "S". In the example in FIG. 28, via conductors (22, 32, 42, 52, 62, 72) are positioned so that the terminal pitch of pads 101 is widened toward the outer layer.

Also, as shown in FIG. 28, via conductors 12 are set to be conformal conductors, and insulative body (12b) (such as resin) may be filled in the inside. Alternatively, through-hole conductors may be used instead of via conductors 12.

Figure 29:
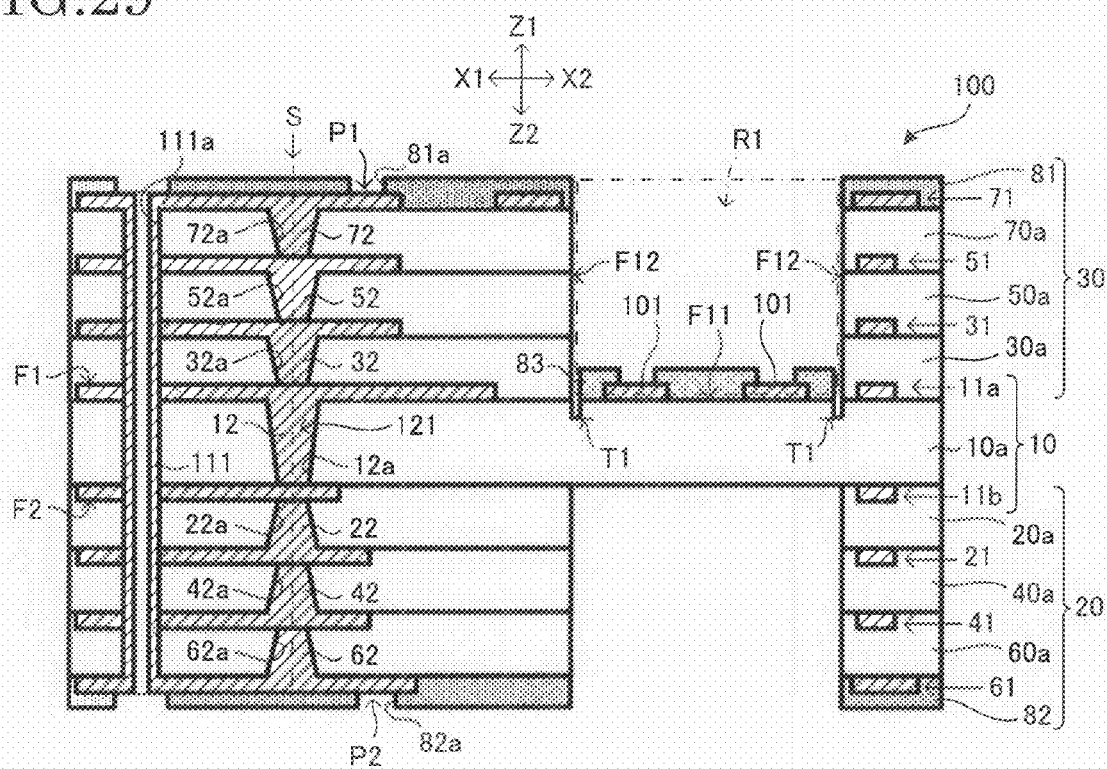
FIG. 29 is a view showing a flex-rigid wiring board according to yet another embodiment of the present invention.

As shown in FIG. 29, for example, wiring board 100 may be a flex-rigid wiring board. In the example in FIG. 29, insulation layer (10a) is made of a flexible substrate.

Figure 30:
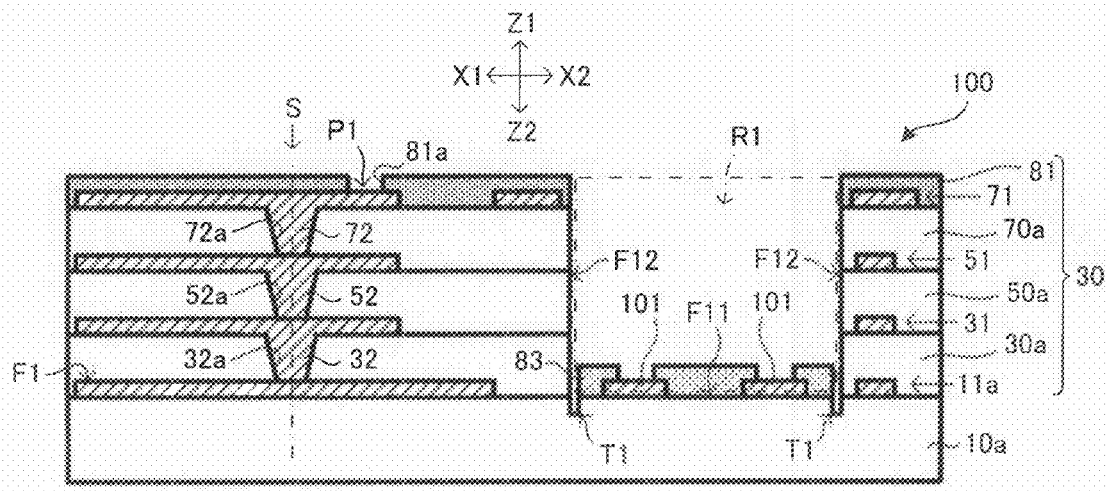
FIG. 30 is a view showing a single-sided wiring board according to yet another embodiment of the present invention.

As shown in FIG. 30, for example, wiring board 100 may be a single-sided wiring board having conductive layers only on one side of the core substrate (insulation layer 10a).

For example, via conductors (12, 22, 32, 42, 52, 62, 72) are not limited to being filled conductors and may each be a conformal conductor.

The material for each conductive layer, via conductor and through-hole conductor is not limited to the above, and may be modified according to usage requirements or the like. For example, metal other than copper may be used as their conductive material. Also, the material for each insulation layer is not limited to a specific type. However, as for the resin to form interlayer insulation layers, thermosetting resins or thermoplastic resins are preferred. As for thermosetting resins, for example, other than epoxy resin, the following may be used: polyimide, BT resin, allyl polyphenylene ether resin (A-PPE resin), aramid resin or the like. Also, as for thermoplastic resins, for example, liquid-crystal polymer (LCP), PEEK resin, PTFE resin (fluoro resin) or the like may be used. Such materials are preferred to be selected according to requirements from the viewpoint of insulation, dielectric properties, tolerance to heat, mechanical features and so forth. In addition, the above resins may contain additives such as a curing agent, a stabilizer, filler or the like. Alternatively, each conductive layer and each insulation layer may be formed with multiple layers made of different materials.

The manufacturing steps of a wiring board are not limited to the order and the contents shown in the flowchart in FIG. 8. The order and the contents may be modified freely within a scope that does not deviate from the gist of the present invention. Also, unnecessary steps may be omitted depending upon usage or the like.

For example, instead of using a laser, dry or wet etching may be employed for processing. When etching is employed for processing, the portions required to remain are preferred to be protected in advance with resist or the like.

In addition, the method for forming each conductive layer is not limited specifically. For example, any method of the following or a combination of two methods selected from among those may be used for forming conductive layers: panel-plating method, pattern-plating method, full-additive method, semi-additive (SAP) method, subtractive method, decal transfer method and tenting method.

The above embodiment and its modified example or the like may be combined freely. It is preferred to use a combination appropriate to usage requirements or the like.

A wiring board according to the first aspect of the present invention has the following: a cavity that opens toward one side; a groove formed on the bottom surface of the cavity and along the wall surfaces of the cavity; and a pad formed on the bottom surface of the cavity in a position farther from the wall surfaces than the groove is.

A method for manufacturing a wiring board according to the second aspect of the present invention includes the following: preparing an insulation layer where a conductive layer containing a pad is formed on a main surface; on the insulation layer and on the conductive layer, forming a buildup section made with one or two or more other insulation layers; by irradiating laser light from the upper-layer side of the buildup section, setting a portion of the buildup section to be separable while forming a groove in the insulation layer; and by removing the separable portion of the buildup section, forming a cavity to have a surface of the insulation layer, where the pads and the groove are formed, as its bottom surface.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   an insulation layer;
   a buildup structure formed on the insulation layer and comprising a plurality of buildup insulation layers, wherein the insulation layer and the buildup structure form a board structure;
   a cavity portion formed in the board structure and having an opening on a surface of the buildup structure opposite to the insulation layer, the cavity portion extending through at least one of the buildup insulation layers in the buildup structure to a first depth such that the cavity portion has a bottom surface and a wall surface, the cavity portion comprising:
   a groove portion formed on the bottom surface of the cavity portion along the wall surface of the cavity portion such that the bottom surface of the cavity portion extends to a second depth recessed from the first depth at the groove portion; and a pad formed on the bottom surface of the cavity portion in a position which is farther from the wall surface of the cavity portion than a position of the groove portion.

2. The wiring board according to claim 1, further comprising a conductive pattern crossing the groove portion of the cavity portion and electrically connected to the pad on the bottom surface of the cavity portion.

3. The wiring board according to claim 1, wherein the groove portion is formed such that the groove portion surrounds a partial region of the bottom surface of the cavity portion along the wall surface of the cavity portion, and the pad is positioned in the partial region on the bottom surface of the cavity portion.

4. The wiring board according to claim 1, further comprising a solder resist layer formed on a portion of the bottom surface of the cavity portion where the groove portion is not formed, wherein the solder resist layer has an opening therein for exposing the pad.

5. The wiring board according to claim 1, wherein the pad comprises an anticorrosion layer forming a surface of the pad.

6. The wiring board according to claim 5, further comprising a solder structure formed on the anticorrosion layer of the pad.

7. The wiring board according to claim 5, further comprising a plurality of additional pads formed on the surface of the buildup structure outside the cavity portion, wherein the additional pads on the surface of the buildup structure each comprises an anticorrosion layer, and the anticorrosion layer on the pad inside the cavity portion comprises a same anticorrosion material as the anticorrosion layers on the pads on the surface of the buildup structure.

8. The wiring board according to claim 1, wherein the buildup structure comprises a laminated structure in which the plurality of buildup insulation layers are laminated, and the cavity portion is formed in the laminated structure.

9. The wiring board according to claim 1, wherein the insulation layer of the board structure is a rigid substrate having a core material, and the groove portion of the cavity portion is formed to penetrate into the rigid substrate.

10. The wiring board according to claim 1, wherein the pad is configured to be electrically connected to one of an electronic component and a wiring board component.

11. The wiring board according to claim 1, wherein the insulation layer has a surface portion forming the bottom surface of the cavity portion, and the groove portion of the cavity portion is formed in the insulation layer such that the groove portion of the cavity portion does not penetrate through the insulation layer.

12. The wiring board according to claim 1, wherein one of the buildup insulation layers in the buildup structure has a surface portion forming the bottom surface of the cavity portion, and the groove portion of the cavity portion is formed in the one of the buildup insulation layers in the buildup structure such that the groove portion of the cavity portion does not penetrate through the one of the buildup insulation layers in the buildup structure.

* * * * *